United States Patent
Yamamoto

(10) Patent No.: US 10,373,852 B2
(45) Date of Patent: Aug. 6, 2019

(54) SUBSTRATE PROCESSING APPARATUS AND METHOD WITH PROCESSING UNIT SELECTION BASED ON USAGE RATE AND USAGE TIME

(71) Applicant: SCREEN Holdings Co., Ltd., Kyoto (JP)

(72) Inventor: Masahiro Yamamoto, Kyoto (JP)

(73) Assignee: SCREEN Holdings Co,. Ltd. (JP)

( * ) Notice: Subject to any disclaimer, the term of this patent is extended or adjusted under 35 U.S.C. 154(b) by 0 days.

(21) Appl. No.: 15/471,393

(22) Filed: Mar. 28, 2017

(65) Prior Publication Data
US 2017/0287760 A1 Oct. 5, 2017

(30) Foreign Application Priority Data
Mar. 30, 2016 (JP) .................. 2016-069183

(51) Int. Cl.
| | |
|---|---|
| *H01L 21/677* | (2006.01) |
| *B08B 1/00* | (2006.01) |
| *B08B 1/02* | (2006.01) |
| *B08B 3/04* | (2006.01) |
| *B08B 3/08* | (2006.01) |
| *H01L 21/67* | (2006.01) |

(52) U.S. Cl.
CPC ........ *H01L 21/67742* (2013.01); *B08B 1/001* (2013.01); *B08B 1/02* (2013.01); *B08B 3/041* (2013.01); *B08B 3/08* (2013.01); *H01L 21/67017* (2013.01); *H01L 21/67046* (2013.01); *H01L 21/67051* (2013.01); *H01L 21/67167* (2013.01); *H01L 21/67173* (2013.01); *H01L 21/67178* (2013.01); *H01L 21/67207* (2013.01); *H01L 21/67276* (2013.01); *H01L 21/67745* (2013.01); *H01L 21/67754* (2013.01)

(58) Field of Classification Search
None
See application file for complete search history.

(56) References Cited

U.S. PATENT DOCUMENTS

| | | | |
|---|---|---|---|
| 2003/0130754 A1 | 7/2003 | Tanaka et al. | ............... 700/99 |
| 2003/0230239 A1* | 12/2003 | Shan | ........... C23C 16/455 118/715 |
| 2004/0230334 A1* | 11/2004 | Geismar | ........... H01L 21/67276 700/121 |

(Continued)

FOREIGN PATENT DOCUMENTS

| | | | |
|---|---|---|---|
| JP | 2001-351846 A | 12/2001 | |
| JP | 2003-203833 A | 7/2003 | |

(Continued)

*Primary Examiner* — Bernard G Lindsay
(74) *Attorney, Agent, or Firm* — Ostrolenk Faber LLP

(57) ABSTRACT

A substrate processing apparatus includes a carrier holding unit which holds a carrier that contains substrates, a plurality of processing units, each of which processes a substrate, a substrate transfer unit which transfers substrates between the carrier and the processing units, and a controller. The controller classifies the plurality of processing units into a plurality of groups and is programmed, when determining a processing unit that is to process a substrate, to select one of the plurality of groups, to select one processing unit belonging to the selected group, and to control the substrate transfer unit to carry a substrate into the selected processing unit.

14 Claims, 22 Drawing Sheets

(56) References Cited

U.S. PATENT DOCUMENTS

| | | | | |
|---|---|---|---|---|
| 2005/0248756 A1* | 11/2005 | Lin | ................... | H01L 21/67253 |
| | | | | 356/237.4 |
| 2006/0195209 A1* | 8/2006 | Tseng | ............... | G05B 19/41865 |
| | | | | 700/99 |
| 2007/0186850 A1 | 8/2007 | Matsuoka et al. | ............ | 118/719 |
| 2013/0073069 A1* | 3/2013 | Yamamoto | ............. | G06Q 10/06 |
| | | | | 700/100 |
| 2013/0190915 A1* | 7/2013 | Choo | ................. | G05B 19/4189 |
| | | | | 700/113 |
| 2013/0258300 A1 | 10/2013 | Nishiyama | ...................... | 355/30 |

FOREIGN PATENT DOCUMENTS

| | | |
|---|---|---|
| JP | 2010-141203 A | 6/2010 |
| TW | 200539349 A | 12/2005 |
| TW | 201351490 A | 12/2013 |

* cited by examiner

MPC

MPC

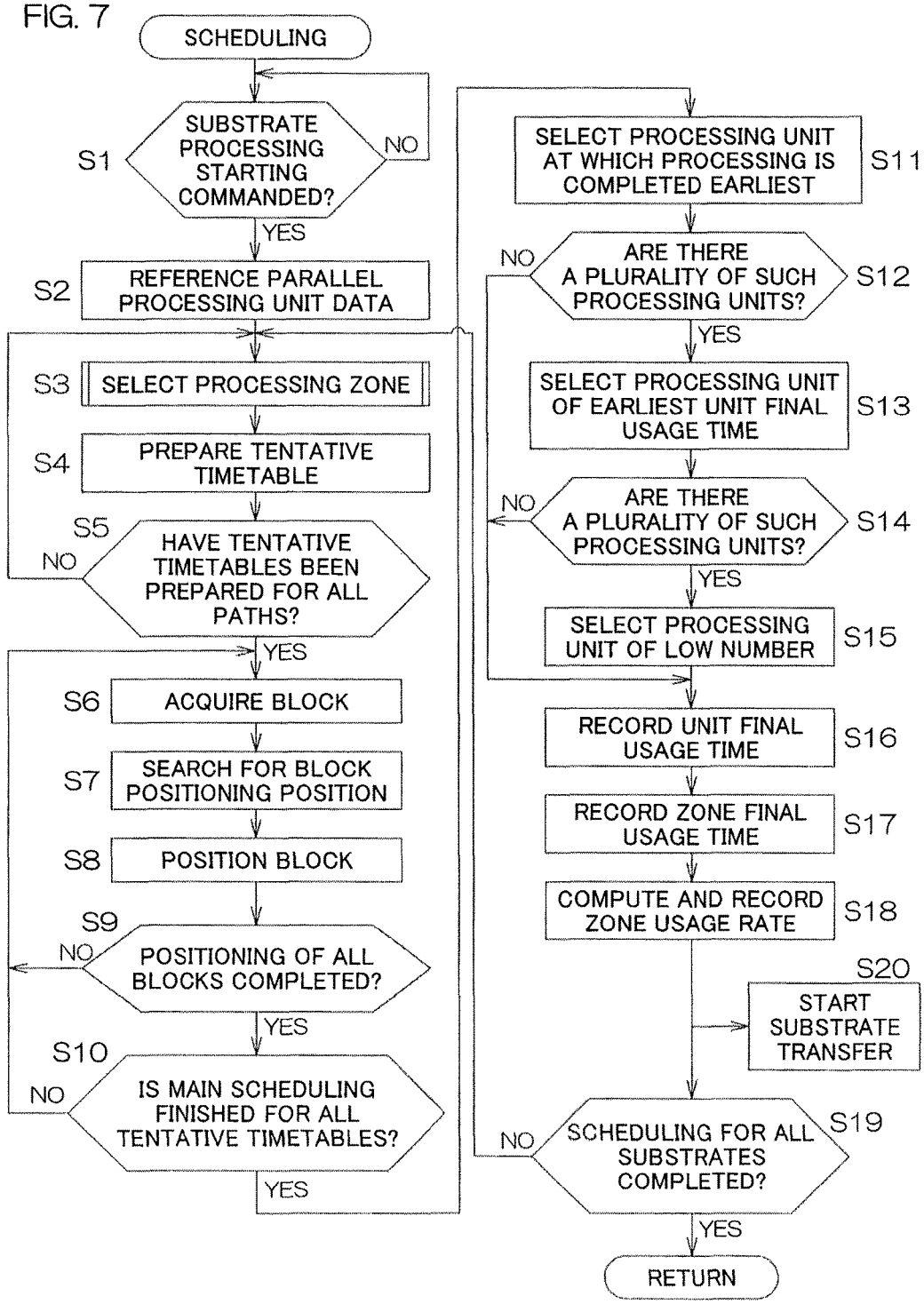

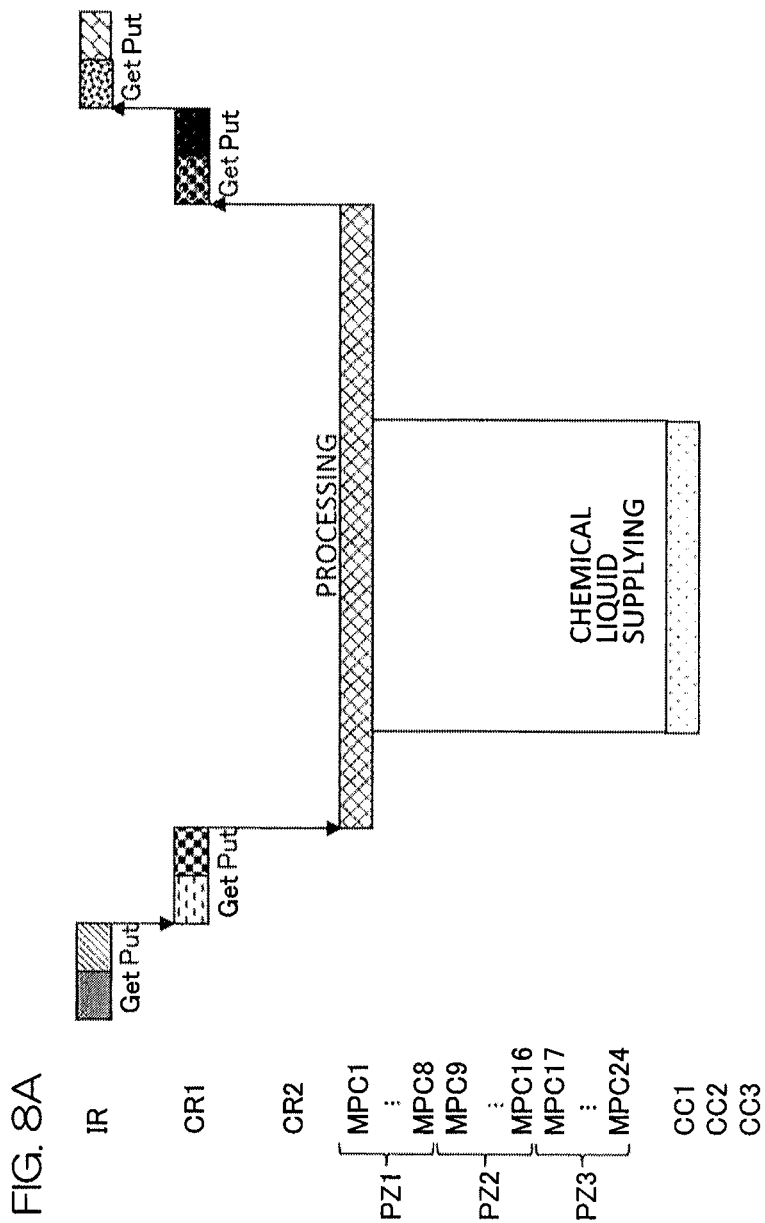

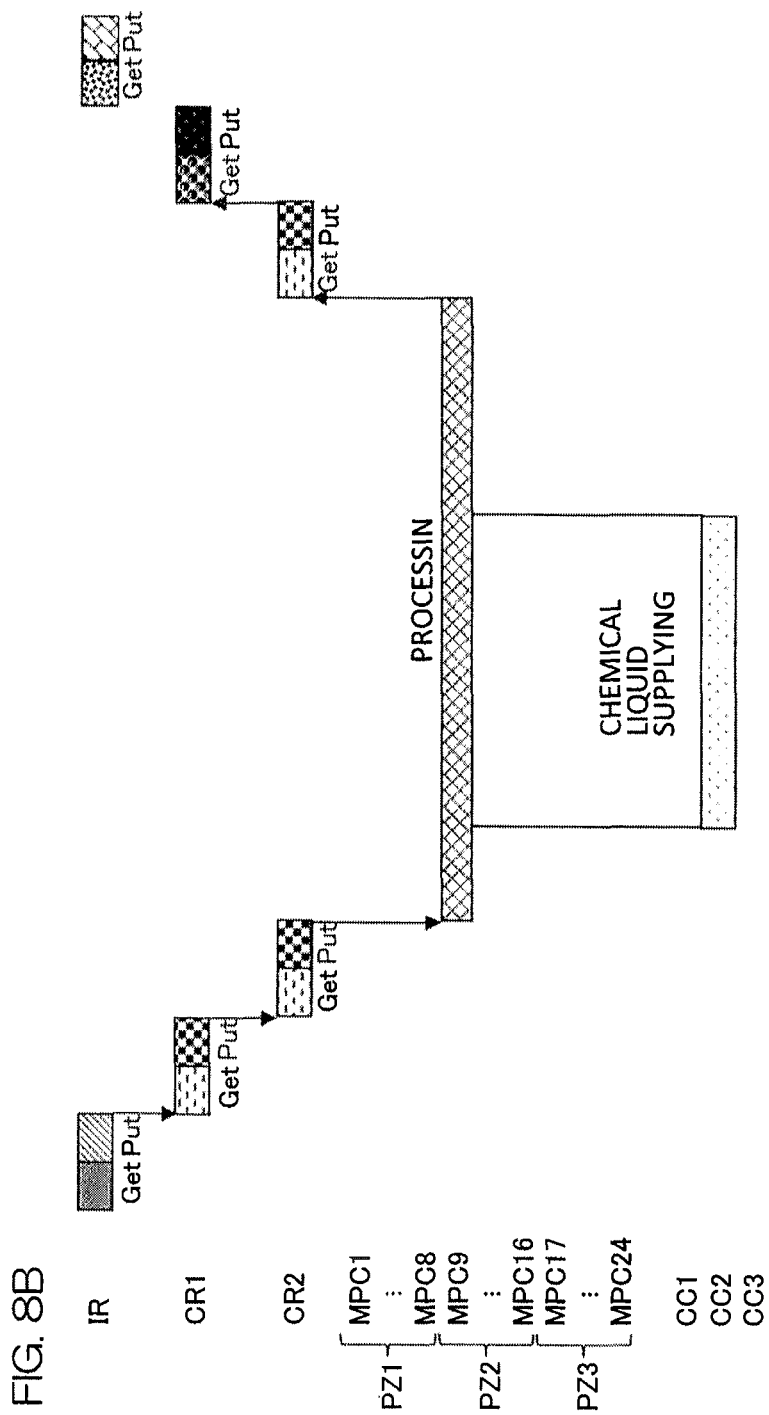

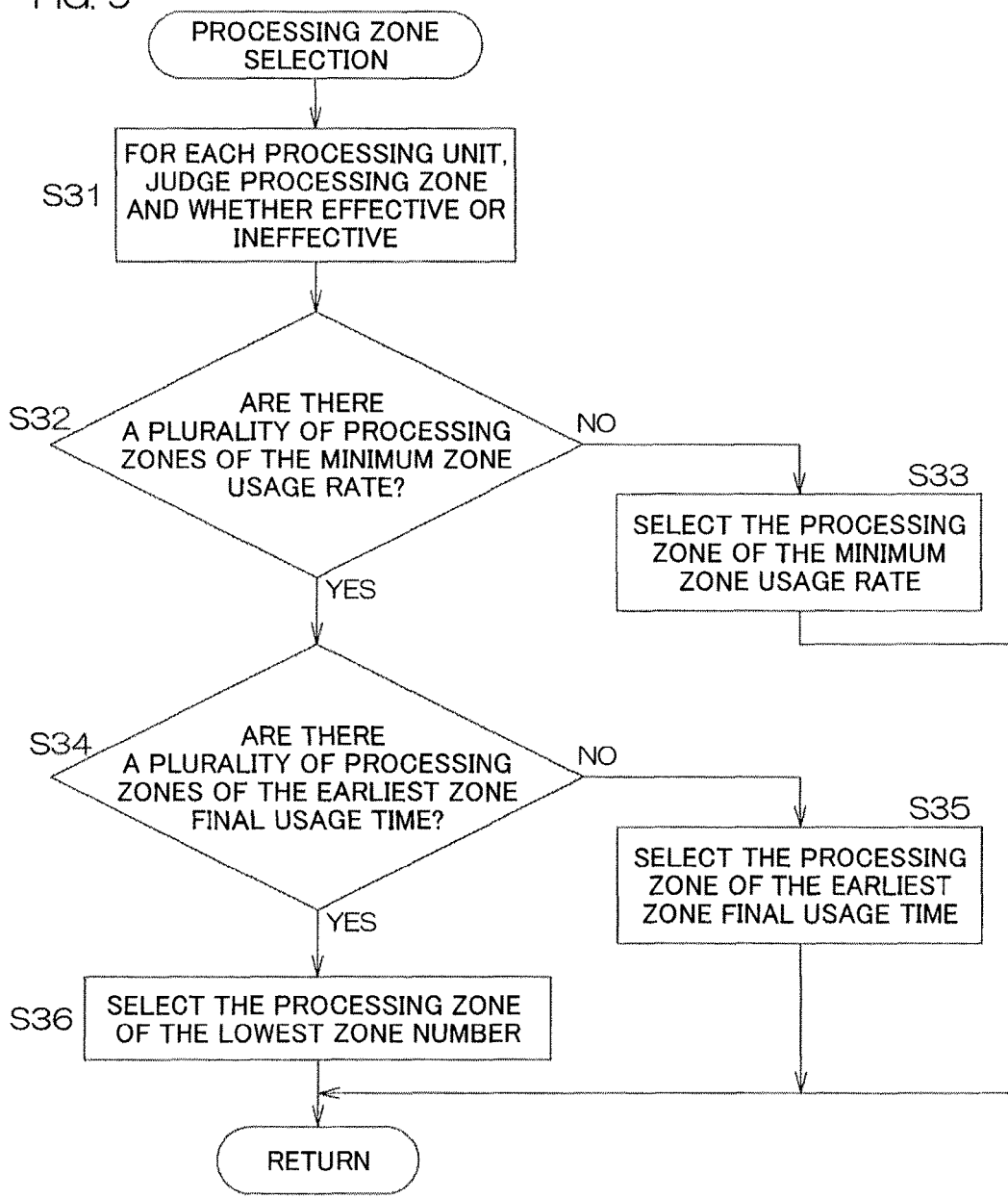

FIG. 10A

| PROCESSING UNIT | PROCESSING ZONE DATA |
|---|---|
| MPC1 | 1 |
| MPC2 | 1 |
| MPC3 | 1 |
| MPC4 | 1 |
| MPC5 | 1 |
| MPC6 | 1 |
| MPC7 | 1 |
| MPC8 | 1 |
| MPC9 | 2 |
| MPC10 | 2 |
| MPC11 | 2 |
| MPC12 | 2 |
| MPC13 | 2 |
| MPC14 | 2 |
| MPC15 | 2 |
| MPC16 | 2 |
| MPC17 | 3 |
| MPC18 | 3 |
| MPC19 | 3 |
| MPC20 | 3 |
| MPC21 | 3 |
| MPC22 | 3 |
| MPC23 | 3 |
| MPC24 | 3 |

FIG. 10B

| PROCESSING UNIT | PROCESSING ZONE DATA |
|---|---|
| MPC1 | 1 |
| MPC2 | 1 |
| MPC3 | 1 |
| MPC4 | 1 |
| MPC5 | IN MAINTENANCE (INEFFECTIVE) |
| MPC6 | IN MAINTENANCE (INEFFECTIVE) |
| MPC7 | IN MAINTENANCE (INEFFECTIVE) |
| MPC8 | IN MAINTENANCE (INEFFECTIVE) |
| MPC9 | 2 |
| MPC10 | 2 |
| MPC11 | 2 |
| MPC12 | 2 |
| MPC13 | 2 |
| MPC14 | 2 |
| MPC15 | 2 |
| MPC16 | 2 |
| MPC17 | 3 |
| MPC18 | 3 |
| MPC19 | 3 |
| MPC20 | 3 |
| MPC21 | 3 |
| MPC22 | 3 |
| MPC23 | 3 |
| MPC24 | 3 |

FIG. 11A  INITIAL STATE

| PROCESSING ZONE | USAGE RATE | ZONE FINAL USAGE TIME |
|---|---|---|
| 1 | 0 | 0 |
| 2 | 0 | 0 |
| 3 | 0 | 0 |

← 82

FIG. 11B  PLANNING OF FIRST SUBSTRATE (PROCESSING TIME: 120 SECONDS)

| PROCESSING ZONE | USAGE RATE | ZONE FINAL USAGE TIME |
|---|---|---|
| 1 | 15 | 12:00:00 |
| 2 | 0 | 0 |
| 3 | 0 | 0 |

← 82

FIG. 11C  PLANNING OF SECOND SUBSTRATE (PROCESSING TIME: 120 SECONDS)

| PROCESSING ZONE | USAGE RATE | ZONE FINAL USAGE TIME |
|---|---|---|
| 1 | 15 | 12:00:00 |
| 2 | 15 | 12:01:00 |
| 3 | 0 | 0 |

← 82

FIG. 11D  PLANNING OF THIRD SUBSTRATE (PROCESSING TIME: 120 SECONDS)

| PROCESSING ZONE | USAGE RATE | ZONE FINAL USAGE TIME |
|---|---|---|
| 1 | 15 | 12:00:00 |
| 2 | 15 | 12:01:00 |
| 3 | 15 | 12:02:00 |

← 82

FIG. 11E  PLANNING OF FOURTH SUBSTRATE (PROCESSING TIME: 120 SECONDS)

| PROCESSING ZONE | USAGE RATE | ZONE FINAL USAGE TIME |
|---|---|---|
| 1 | 30 | 12:03:00 |
| 2 | 15 | 12:01:00 |
| 3 | 15 | 12:02:00 |

← 82

FIG. 12A  INITIAL STATE

| PROCESSING ZONE | USAGE RATE | ZONE FINAL USAGE TIME |
|---|---|---|
| 1 | 0 | 0 |
| 2 | 0 | 0 |
| 3 | 0 | 0 |

82

FIG. 12B  PLANNING OF FIRST SUBSTRATE (PROCESSING TIME: 120 SECONDS)

| PROCESSING ZONE | USAGE RATE | ZONE FINAL USAGE TIME |
|---|---|---|
| 1 | 30 | 12:01:00 |
| 2 | 0 | 0 |
| 3 | 0 | 0 |

82

FIG. 12C  PLANNING OF SECOND SUBSTRATE (PROCESSING TIME: 120 SECONDS)

| PROCESSING ZONE | USAGE RATE | ZONE FINAL USAGE TIME |
|---|---|---|
| 1 | 30 | 12:01:00 |
| 2 | 15 | 12:02:00 |
| 3 | 0 | 0 |

82

FIG. 12D  PLANNING OF THIRD SUBSTRATE (PROCESSING TIME: 120 SECONDS)

| PROCESSING ZONE | USAGE RATE | ZONE FINAL USAGE TIME |
|---|---|---|
| 1 | 30 | 12:01:00 |
| 2 | 15 | 12:02:00 |
| 3 | 15 | 12:03:00 |

82

FIG. 12E  PLANNING OF FOURTH SUBSTRATE (PROCESSING TIME: 120 SECONDS)

| PROCESSING ZONE | USAGE RATE | ZONE FINAL USAGE TIME |
|---|---|---|
| 1 | 30 | 12:01:00 |
| 2 | 30 | 12:04:00 |
| 3 | 15 | 12:03:00 |

82

FIG. 12F  PLANNING OF FIFTH SUBSTRATE (PROCESSING TIME: 120 SECONDS)

| PROCESSING ZONE | USAGE RATE | ZONE FINAL USAGE TIME |
|---|---|---|
| 1 | 30 | 12:01:00 |
| 2 | 30 | 12:04:00 |
| 3 | 30 | 12:05:00 |

82

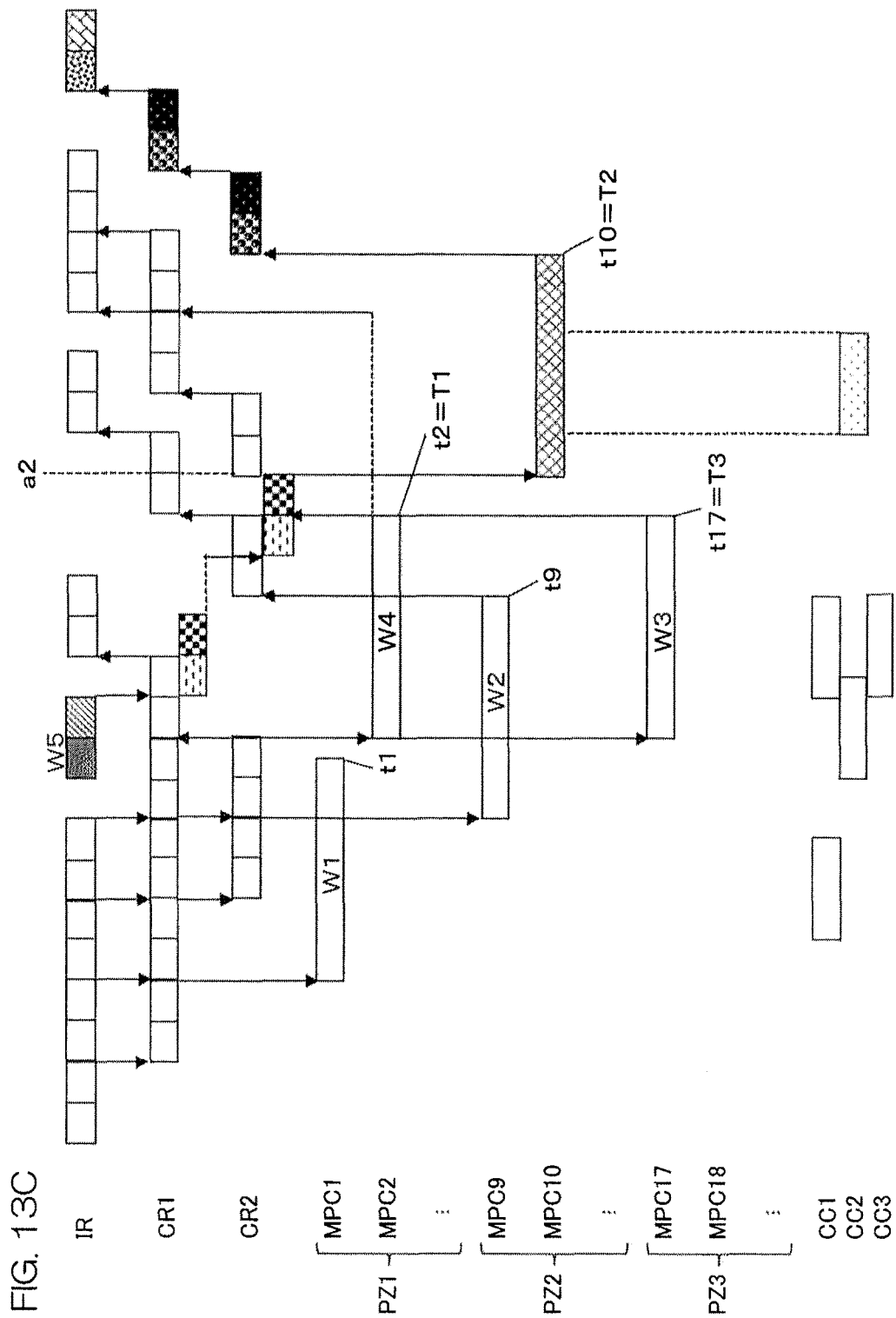

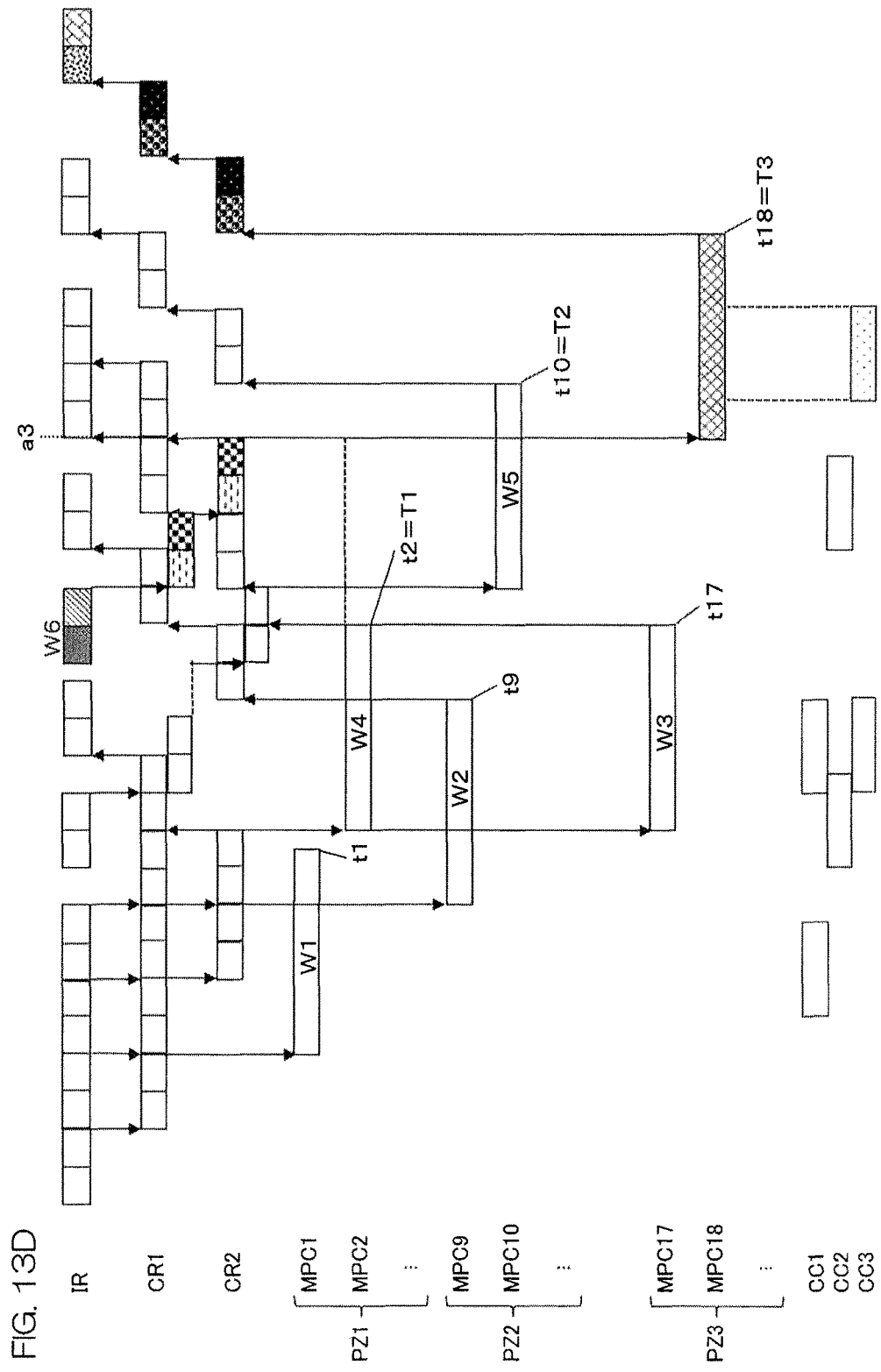

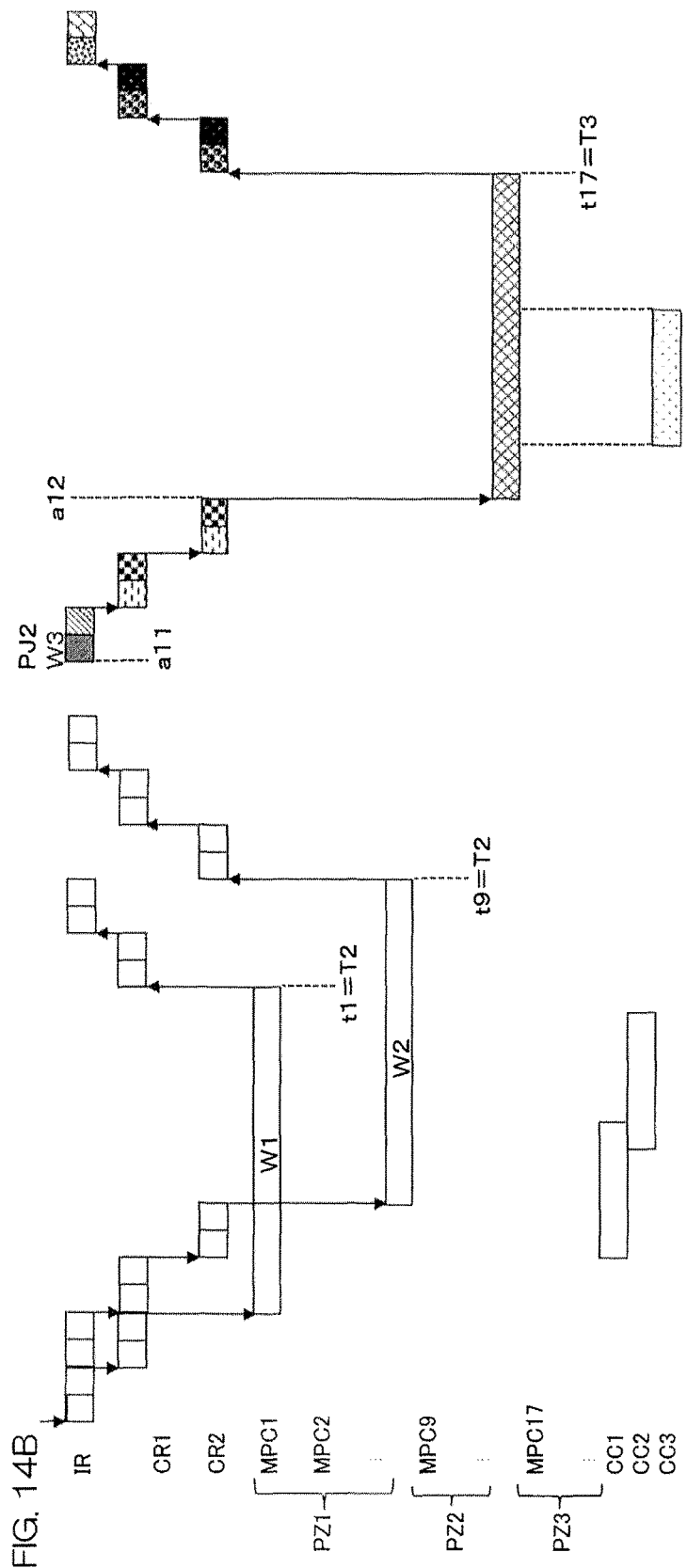

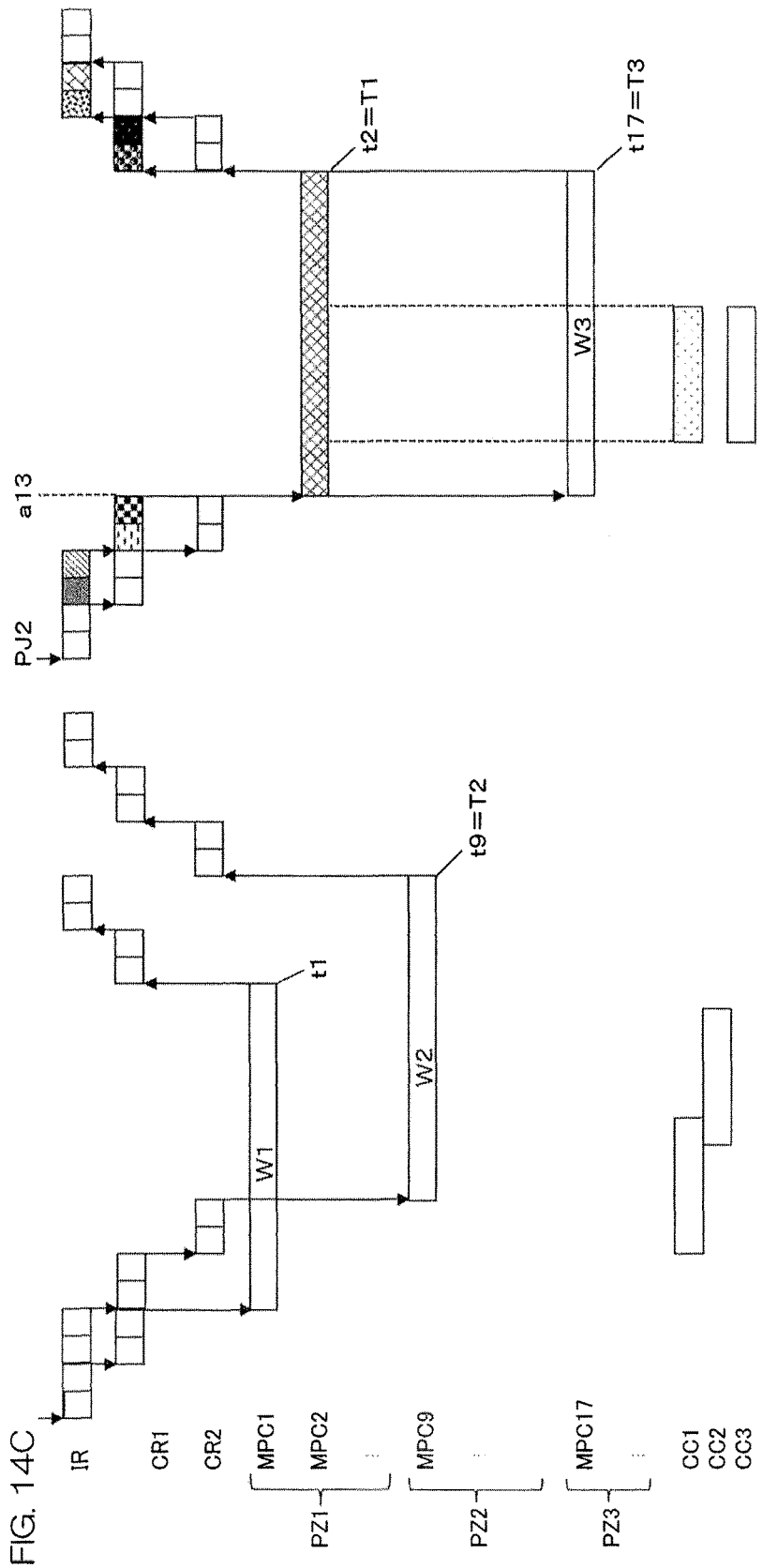

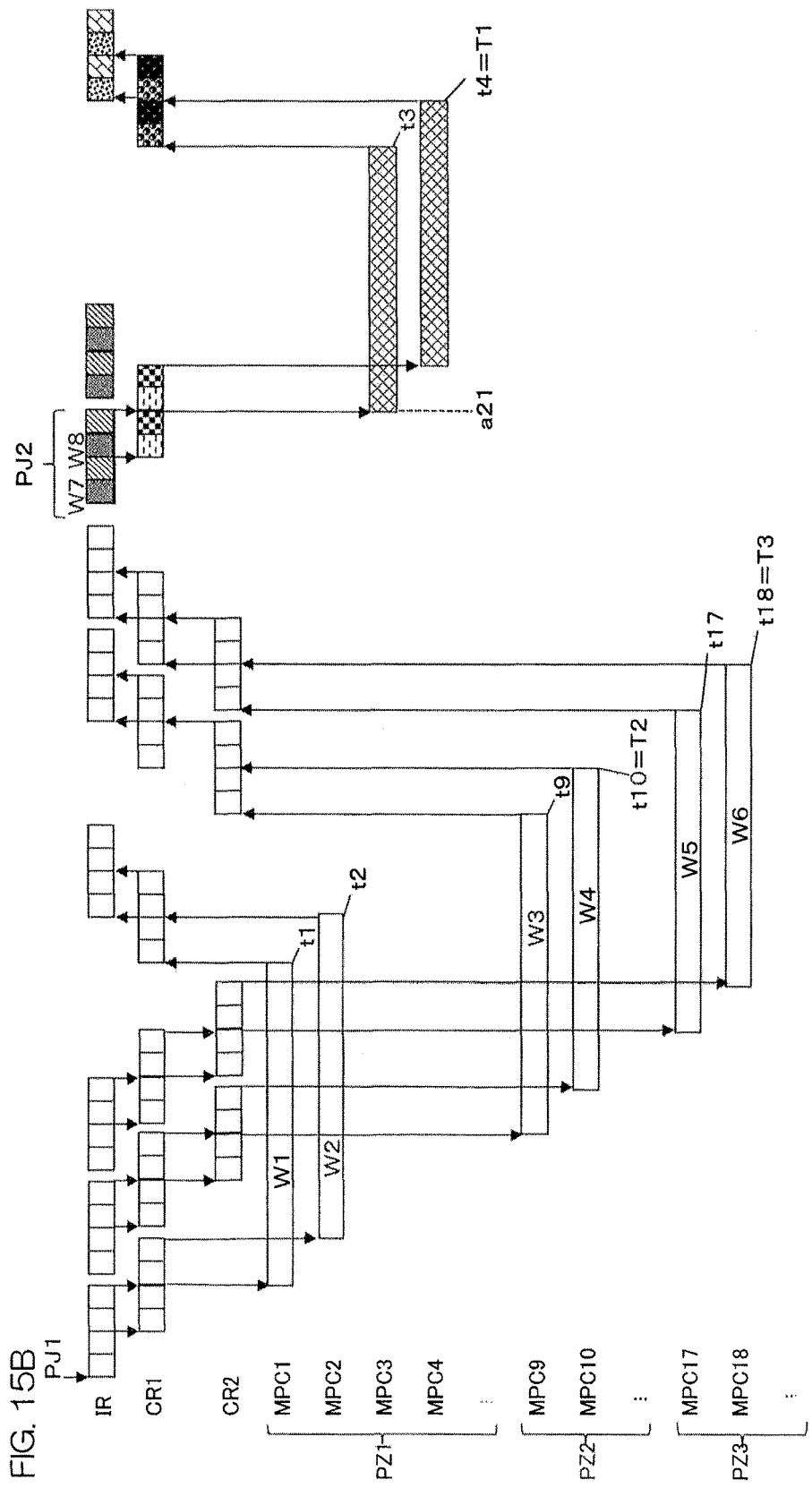

SUBSTRATE PROCESSING APPARATUS AND METHOD WITH PROCESSING UNIT SELECTION BASED ON USAGE RATE AND USAGE TIME

BACKGROUND OF THE INVENTION

1. Field of the Invention

The present invention relates to a substrate processing apparatus and a substrate processing method for processing a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of the Related Art

United States Patent Application Publication No. 2013/073069 discloses scheduling for a substrate processing apparatus having a plurality of processing units. With this prior art, for each individual substrate to be processed, a plurality of tentative timetables, expressing a plurality of paths respectively passing through a plurality of processing units capable of executing the processing designated for the substrate, are prepared. One tentative timetable is then selected and scheduling, which specifies substrate transfer and substrate processing for a single substrate, is performed by positioning each block, constituting the selected tentative timetable, at an earliest possible position on a time axis while avoiding overlapping use of the same resource at the same time.

SUMMARY OF THE INVENTION

To maximize production efficiency of a substrate processing apparatus, a tentative timetable selected for a certain substrate should be a tentative timetable such that when the blocks are positioned on the time axis, the processing of the substrate is completed quickest. The substrate should thus be processed by the processing unit included in the path specified by that tentative timetable. If two or more tentative timetables are present with which processing completion times become equal when the blocks are positioned on the timetable, for example, a priority order is designated in advance for the plurality of processing units and the tentative timetable is selected (that is, the processing unit is selected) in accordance with the priority order.

However, the present inventor noted that there is a problem with a method such as the above when there are large differences in transfer times from a carrier holding portion, holding a carrier that contains unprocessed substrates or processed substrates, to the plurality of processing units. That is, with a method for selecting the tentative timetable such as described above, it is unlikely for a tentative timetable, specifying a path passing through a processing unit for which the transfer time with respect to the carrier holding portion is long, to be selected. A large difference in usage frequency thus arises among the plurality of processing units. That is, the usage frequency of a processing unit for which the transfer time with respect to the carrier holding portion is short will be high and the usage frequency of a processing unit for which the transfer time with respect to the carrier holding portion is long will be low.

A problem in terms of management of the substrate processing apparatus may occur due to such variation in usage frequency.

For example, a load applied to a mechanism portion or expandable part included in each processing unit may vary among the plurality of processing units such that change with time of the mechanism portion or expendable part does not occur uniformly among the plurality of processing units and consequently, an interval of maintenance work, such as parts replacement, etc., may become short for a specific processing unit. Productivity is influenced because operation of the entire substrate processing apparatus must be stopped for such maintenance work. Influences on substrate processing may also occur when differences arise in degradation (permanent set-in fatigue) of an expendable part used for substrate processing in each processing unit.

Further if a plurality of chemical liquid supply sources that supply a chemical liquid to the processing units are provided, load may become biased on a portion of the chemical liquid supply sources. For example, if a chemical liquid consumption amount is high for a portion of the chemical liquid supply sources and a chemical liquid replenishing interval is short for such chemical liquid supply sources, management of chemical liquid replenishment becomes difficult. Also, variations arise in degradation of parts, such as a pump for supplying the chemical liquid, etc., and therefore variations also arise in intervals of maintenance work, such as parts replacement, etc. Management of the maintenance work is thereby made difficult.

Yet further, with a processing unit of low usage frequency, if an unused state is sustained for a long period of time, particles may form due to crystallization in the chemical liquid inside a chamber of the processing unit and this may have adverse effects on quality of subsequent substrate processing.

An object of the present invention is thus to provide a substrate processing apparatus and a substrate processing method that are advantageous for lowering variation of usage frequency among a plurality of processing units.

The present invention includes a carrier holding unit which holds a carrier that contains substrates, a plurality of processing units, each of which process a substrate, a substrate transfer unit which transfers substrates between the carrier held by the carrier holding unit and the plurality of processing units, and a controller which controls the plurality of processing units and the substrate transfer unit. The controller classifies the plurality of processing units into a plurality of groups in advance and is programmed to execute, when determining a processing unit that is to process a substrate, a group selection step of selecting one of the plurality of groups, a unit selection step of selecting one processing unit which belongs to the one group selected in the group selection step, and a step of controlling the substrate transfer unit to carry a substrate to be processed into the processing unit selected in the unit selection step.

With the present arrangement, the plurality of processing units are classified into groups and upon selecting a certain group, a processing unit within that group is selected and the substrate is processed by the selected processing unit. Variation of usage frequency among the plurality of processing units can thereby be reduced readily.

Also by selecting one group in advance, it suffices for the controller to select one processing unit from the processing units belonging to the selected group. By thus selecting the processing unit in stepwise manner, a computing load of the controller can be lightened in comparison to a case of regarding all processing units to be equivalent and selecting one processing unit in one step. Accordingly, the time it takes for the controller to select one processing unit can be shortened, so that substrate processing can be started early and productivity of the substrate processing apparatus can be improved accordingly.

In the preferred embodiment of the present invention, the plurality of processing units are classified into the plurality of groups based on transfer path lengths or transfer times between the carrier holding unit and the respective processing units. A rule that selects a processing unit, for which the transfer path length or transfer time from the carrier holding unit is long, can thereby be prepared readily to enable the variation of usage frequency among the processing units to be reduced readily.

In the preferred embodiment of the present invention, the substrate transfer unit includes a first transfer robot and a second transfer robot that receives and passes a substrate from and to the first transfer robot, and the plurality of groups include a first group, constituted of processing units accessed directly by the first transfer robot, and a second group, constituted of processing units accessed directly by the second transfer robot. Substrate transfer between the carrier held by the carrier holding unit and a processing unit of the second group is performed by both the first transfer robot and the second transfer robot. With such an arrangement, both the first and second transfer robots mediate substrate transfers to the processing units constituting the second group. The transfer path and the transfer time between the carrier and the second group are thus long. Even with such an arrangement, the variation of usage frequency among the processing units between the first and second groups can be suppressed. The variation of usage frequency among the processing units can thus be suppressed while equipping a large number of processing units to increase productivity. Also, the computing load of the controller can be suppressed while equipping a large number of processing units to increase productivity.

In the preferred embodiment of the present invention, the plurality of processing units are arranged to process substrates by a processing fluid, and the plurality of processing units are classified into the plurality of groups according to each plurality of processing units which share a processing fluid supply source that supplies the processing fluid.

With the present arrangement, a plurality of processing units sharing a processing fluid supply source belong to the same group and therefore a processing fluid supply source can be selected by selecting a group. Variation of usage frequency among the processing fluid supply sources can thereby be reduced readily.

In the preferred embodiment of the present invention, uniform selection among the plurality of groups is performed in the group selection step. With the present arrangement, the variation of usage frequency among the processing units can be reduced.

In the preferred embodiment of the present invention, the group selection step includes a step of recording a group final usage time, which is the time at which each group was used last for substrate processing, and a step of selecting a group based on the group final usage time (preferably, selecting a group of the oldest group final usage time). With the present arrangement, it becomes easy to select groups uniformly and accordingly, the variation of usage frequency among the processing units can be reduced readily.

In the preferred embodiment of the present invention, the group selection step includes a step of computing a group usage rate, which is a rate of use for substrate processing of processing units which belong to each group, and a step of selecting a group based on the group usage rate (preferably, selecting a group of the lowest usage rate). With the present arrangement, it becomes easy to reduce variation of the group usage rate and accordingly, the variation of usage frequency among the processing units can be reduced readily.

In the preferred embodiment of the present invention, uniform selection among the processing units in each group is performed in the unit selection step. Variation of usage frequency among the processing units in each group can thereby be reduced.

In the preferred embodiment of the present invention, the unit selection step includes a step of recording a unit final usage time, which is the time at which each processing unit was used last for substrate processing, and a step of selecting the processing unit of the oldest unit final usage time. With the present arrangement, the variation of usage frequency among the processing units in each group can be reduced readily.

The present invention further provides a substrate processing method including a step of classifying a plurality of processing units, each of which processes a substrate, into a plurality of groups in advance, a group selection step of selecting one of the plurality of groups, a unit selection step of selecting one processing unit which belongs to the one group selected in the group selection step, and a step of carrying, by means of a substrate transfer unit, a substrate to be processed into the processing unit selected in the unit selection step.

In the substrate processing method according to the preferred embodiment of the present invention, the plurality of processing units are classified into the plurality of groups based on transfer path lengths or transfer times between a carrier holding unit, which holds a carrier that contains substrates, and the respective processing units, and the substrate transfer unit transfers a substrate from the carrier to the processing unit selected in the unit selection step.

In the substrate processing method according to the preferred embodiment of the present invention, the substrate transfer unit includes a first transfer robot and a second transfer robot that receives and passes a substrate from and to the first transfer robot, the plurality of groups include a first group, constituted of processing units accessed directly by the first transfer robot, and a second group, constituted of processing units accessed directly by the second transfer robot, and substrate transfer between the carrier held by the carrier holding unit and a processing unit of the second group is performed by both the first transfer robot and the second transfer robot.

In the substrate processing method according to the preferred embodiment of the present invention, the plurality of processing units are arranged to process substrates by a processing fluid, and the plurality of processing units are classified into the plurality of groups according to each plurality of processing units which share a processing fluid supply source that supplies the processing fluid.

In the substrate processing method according to the preferred embodiment of the present invention, uniform selection among the plurality of groups is performed in the group selection step.

In the substrate processing method according to the preferred embodiment of the present invention, the group selection step includes a step of recording a group final usage time, which is the time at which each group was used last for substrate processing, and a step of selecting a group based on the group final usage time (preferably, selecting a group of the oldest group final usage time).

In the substrate processing method according to the preferred embodiment of the present invention, the group selection step includes a step of computing a group usage rate, which is a rate of use for substrate processing of processing units which belong to each group, and a step of selecting a group based on the group usage rate (preferably, selecting a group of the lowest usage rate).

In the substrate processing method according to the preferred embodiment of the present invention, uniform selection among the processing units in each group is performed in the unit selection step.

In the substrate processing method according to the preferred embodiment of the present invention, the unit selection step includes a step of recording a unit final usage time, which is the time at which each processing unit was used last for substrate processing, and a step of selecting the processing unit of the oldest unit final usage time.

The above and other elements, features, steps, and characteristics and advantages of the present invention will become more apparent from the following detailed description of preferred embodiments with reference to the attached drawings.

BRIEF DESCRIPTION OF THE DRAWINGS

FIG. 7 is a flowchart for describing a processing example performed by a computer included in the substrate processing apparatus.

FIG. 8A to FIG. 8C show a tentative timetable prepared during scheduling.

FIG. 9 is a flowchart for describing an example of processing zone selection processing (step S3 of FIG. 7).

FIG. 10A and FIG. 10B show examples of processing zone data stored in a storage portion of a computer in relation to the processing zone selection processing.

FIG. 11A to FIG. 11E show an example of transition of usage history data stored in the storage portion of the computer in relation to the processing zone selection processing.

FIG. 12A to FIG. 12F show an example of transition of usage history data stored in the storage portion of the computer in relation to the processing zone selection processing.

FIG. 13A to FIG. 13D show an example of scheduling.

FIG. 14A to FIG. 14C show another example of scheduling.

FIG. 15B shows an example of scheduling in a substrate processing apparatus according to the other preferred embodiment of the present invention.

DETAILED DESCRIPTION OF THE PREFERRED EMBODIMENTS

Figure 1:
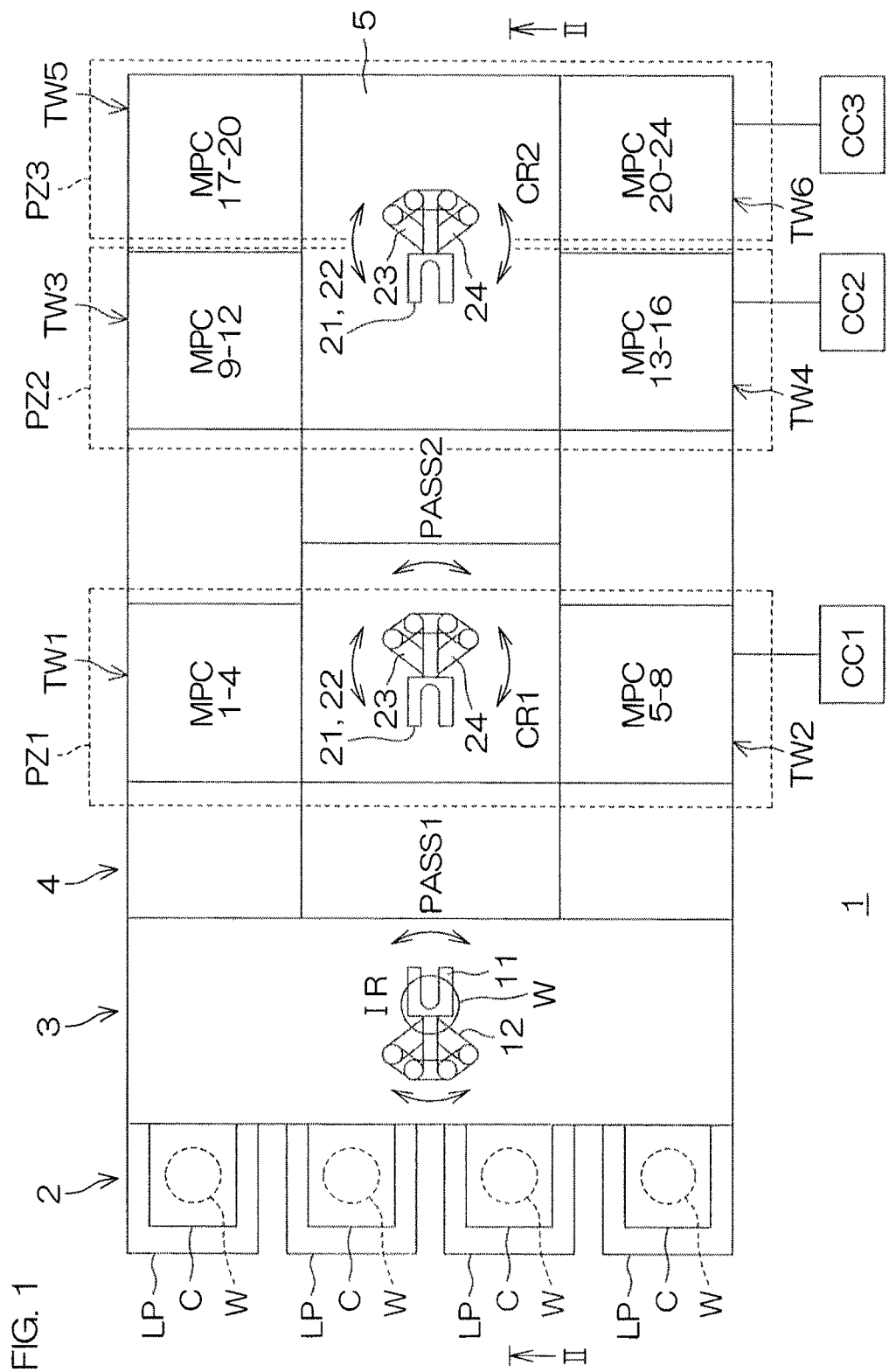
FIG. 1 is an illustrative plan view for describing the arrangement of a substrate processing apparatus according to a preferred embodiment of the present invention.
Figure 2:
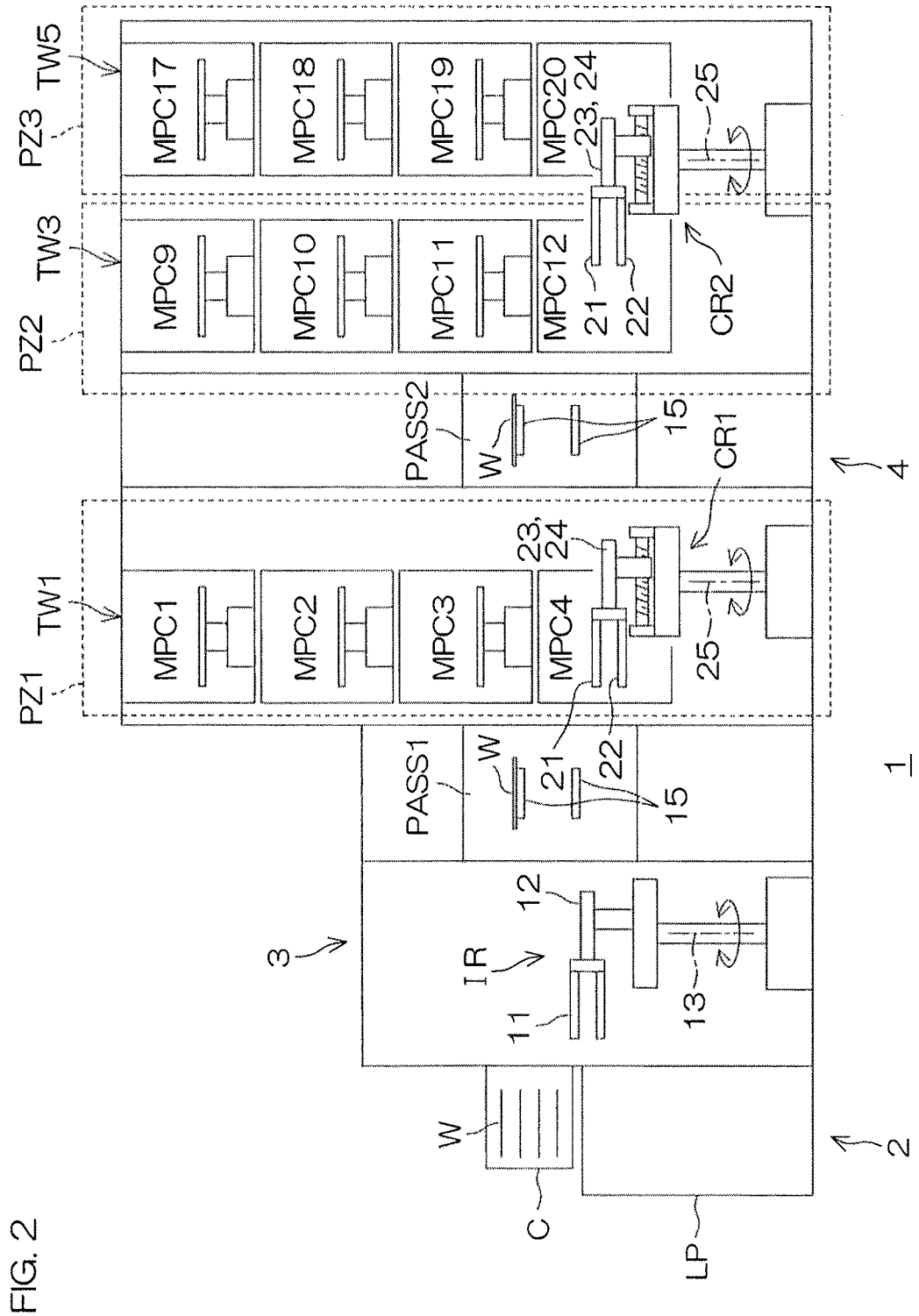
FIG. 2 is an illustrative sectional view corresponding to section line II-II of FIG. 1.

FIG. 1 is an illustrative plan view for describing the arrangement of a substrate processing apparatus according to a preferred embodiment of the present invention. FIG. 2 is an illustrative sectional view corresponding to section line II-II of FIG. 1.

The substrate processing apparatus 1 includes a carrier holding portion 2, an indexer portion 3, and a processing portion 4. The carrier holding portion 2 includes a plurality of load ports LP, each holding a carrier C, which is a substrate container capable of containing a plurality of substrates W. The indexer portion 3 includes an indexer robot IR. The indexer robot IR executes a carrying-in operation of taking out an unprocessed substrate W from a carrier C held by the carrier holding portion 2 and passing it to the processing portion 4 and a housing operation of receiving a processed substrate W from the processing portion 4 and housing it in a carrier C held by the carrier holding portion 2.

The processing portion 4 includes a plurality of processing units MPC1 to MPC24 (each referred to hereinafter as "processing unit MPC" when referred to in general), a first main transfer robot CR1 (first transfer robot), a second main transfer robot CR2 (second transfer robot), a first receiving/passing unit PASS1, and a second receiving/passing unit PASS2. A transfer passage 5, extending rectilinearly from the indexer portion 3 in plan view, is formed inside the processing portion 4. Within the transfer passage 5, the first receiving/passing unit PASS1, the first main transfer robot CR1, the second receiving/passing unit PASS2, and the second main transfer robot CR2 are disposed successively from the indexer portion 3 side. The first receiving/passing unit PASS1 is a unit that mediates passing and receiving of a substrate W between the indexer robot IR and the first main transfer robot CR1. The second receiving/passing unit PASS2 is a unit that mediates passing and receiving of a substrate W between the first main transfer robot CR1 and the second main transfer robot CR2.

The indexer robot IR, the first main transfer robot CR1, and the second main transfer robot CR2 constitute a substrate transfer unit that transfers the substrates W between the carrier holding portion 2 and the processing units MPC.

The plurality of processing units MPC are disposed dispersedly so as to form a plurality of unit towers TW1 to TW6 (each referred to hereinafter as "unit tower TW" when referred to in general). Each unit tower TW is formed by stacking a plurality of processing units MPC in a plurality of layers (four layers in the present preferred embodiment). In the present preferred embodiment, each unit tower TW is formed by stacking four processing units MPC in a vertical direction. The plurality of unit towers TW are distributed to both sides of the transfer passage 5 and are aligned along the transfer passage 5. Specifically, in the present preferred embodiment, the three unit towers TW1, TW3, and TW5 are aligned at one side of the transfer passage 5 and the three unit towers TW2, TW4, and TW6 are aligned at the other side of the transfer passage 5. Constituent members of each of three pairs of unit towers TW1, TW2; TW3, TW4; and TW5, TW6 face each other across the transfer passage 5. Therefore with each of the pairs of unit towers TW1, TW2; TW3, TW4; and TW5, TW6, the constituent members are substantially equal in substrate transfer distance with respect to the indexer portion 3 and accordingly, substantially equal in substrate transfer time with respect to the indexer portion 3.

The respective pairs of unit towers TW1, TW2; TW3, TW4; and TW5, TW6, with each of which the constituent members are equal in distance from the indexer portion 3, respectively form processing zones PZ1, PZ2, and PZ3 (each referred to hereinafter as "processing zone PZ" when referred to in general). That is, the pair of unit towers TW1 and TW2, which face each other across the transfer passage 5 at positions closest to the indexer portion 3, form the first processing zone PZ1. The pair of unit towers TW3 and TW4, which face each other across the transfer passage 5 at positions next closest to the indexer portion 3, form the second processing zone PZ2. The pair of unit towers TW5 and TW6, which face each other across the transfer passage 5 at positions next closest to the indexer portion 3, positions furthest from the indexer portion 3 in the present preferred embodiment, form the third processing zone PZ3.

The first receiving/passing unit PASS1 is disposed between the first processing zone PZ1 and the indexer portion 3. The first main transfer robot CR1 is disposed at a side opposite the indexer portion 3 with respect to the first receiving/passing unit PASS1. The first main transfer robot CR1 is disposed at a position close to the first processing zone PZ1, more specifically, a position between the pair of unit towers TW1 and TW2 that form the first processing zone PZ1. The second receiving/passing unit PASS2 is disposed at a side opposite the first receiving/passing unit PASS1 with respect to the first main transfer robot CR1. The first main transfer robot CR1 is thereby disposed to face the first receiving/passing unit PASS1, the unit towers TW1 and TW2 of the first processing zone PZ1, and the second receiving/passing unit PASS2.

The second main transfer robot CR2 is disposed at a side opposite the first main transfer robot CR1 with respect to the second receiving/passing unit PASS2. The second main transfer robot CR2 is disposed at a position close to the second processing zone PZ2 and the third processing zone PZ3, more specifically, a position surrounded by the two pairs of unit towers TW3, TW4; and TW5, TW6 that form the second and third processing zones PZ2 and PZ3. The second main transfer robot CR2 is thereby disposed to face the second receiving/passing unit PASS2 and the unit towers TW3 to TW6 of the second and third processing zones PZ2 and PZ3.

In the present preferred embodiment, the indexer robot IR is a horizontal articulated arm type robot. The indexer robot IR includes a hand 11 which holds a substrate W, an articulated arm 12 which is coupled to the hand 11, an arm rotating mechanism (not shown) which rotates the articulated arm 12 around a vertical rotational axis 13, and an arm elevating/lowering mechanism (not shown) which moves the articulated arm 12 vertically. With such an arrangement, the indexer robot IR makes the hand 11 access a carrier C, held by any of the load ports LP, or the first receiving/passing unit PASS1 to carry-in/carry-out the substrate W with respect to the access destination. The indexer robot IR thereby transfers the substrate W between the processing portion 4 (more accurately, the first receiving/passing unit PASS1) and any of the carriers C.

As the first main transfer robot CR1 and the second main transfer robot CR2, substrate transfer robots having substantially the same arrangement may be used. Such a substrate transfer robot preferably includes a pair of hands 21 and 22, each of which holds a substrate W, a pair of hand advancing/retreating mechanisms 23 and 24, which respectively make the pair of hands 21 and 22 advance and retreat in a horizontal direction (radial direction), a hand rotating mechanism (not shown), which rotates the pair of hand advancing/retreating mechanisms 23 and 24 around a vertical rotational axis 25, and a hand elevating/lowering mechanism (not shown), which moves the hand advancing/retreating mechanisms 23 and 24 vertically. A substrate W can thereby be taken out from an access destination by one of the hands 21 and 22, and a substrate W can be carried into an access destination by the other hand 21 or 22. By applying the substrate transfer robot of such arrangement as the first main transfer robot CR1, the first main transfer robot CR1 is made capable of making the hands 21 and 22 directly access the first receiving/passing unit PASS1, the plurality of processing units MPC forming the unit towers TW1 and TW2 of the first processing zone PZ1, and the second receiving/passing unit PASS2 and performing carry-in/carry-out of a substrate W with respect to the access destination. Also, by applying the substrate transfer robot of an arrangement such as described above as the second main transfer robot CR2, the second main transfer robot CR2 is made capable of making the hands 21 and 22 directly access the second receiving/passing unit PASS2 and the plurality of processing units MPC forming the unit towers TW3 to TW6 of the second and third processing zones PZ2 and PZ3 and performing carry-in/carry-out of a substrate W with respect to the access destination.

Each of the first and second receiving/passing units PASS1 and PASS2 includes a substrate mount 15 that holds a substrate W temporarily.

Three chemical liquid cabinets CC1, CC2, and CC3 (chemical fluid supply sources; each being an example of a processing liquid supply source; each referred to hereinafter as "chemical liquid cabinet CC" when referred to in general) are provided in respectively corresponding to the first processing zone PZ1, the second processing zone PZ2, and the third processing zone PZ3. The first chemical liquid cabinet CC1 supplies a chemical liquid (an example of a processing fluid) for processing a substrate W to the plurality of processing units MPC forming the first processing zone PZ1. That is, the first chemical liquid cabinet CC1 is shared by the plurality of processing units MPC included in the first processing zone PZ1. Similarly, the second chemical liquid cabinet CC2 supplies the chemical liquid for processing a substrate W to the plurality of processing units MPC forming the second processing zone PZ2. That is, the second chemical liquid cabinet CC2 is shared by the plurality of processing units MPC included in the second processing zone PZ2. Further similarly, the third chemical liquid cabinet CC3 supplies the chemical liquid for processing a substrate W to the plurality of processing units MPC forming the third processing zone PZ3. That is, the third chemical liquid cabinet CC3 is shared by the plurality of processing units MPC included in the third processing zone PZ3.

Although in FIG. 1, the first to third chemical liquid cabinets CC1, CC2, and CC3 are drawn at one side of the processing portion 4, these may be disposed at other locations. For example, a portion or all of the first to third chemical liquid cabinets CC1, CC2, and CC3 may be disposed at a vicinity of an end portion of the transfer passage 5 at a side opposite the indexer portion 3. Also, a portion or all of the first to third chemical liquid cabinets CC1, CC2, and CC3 may be disposed in a downstairs space lower than a floor surface on which a substrate processing apparatus main body, including the processing units MPC, etc., is disposed. That is, the chemical liquid cabinets CC may be disposed three-dimensionally with respect to the substrate processing apparatus main body to reduce an area occupied by the entire apparatus.

Figure 3:
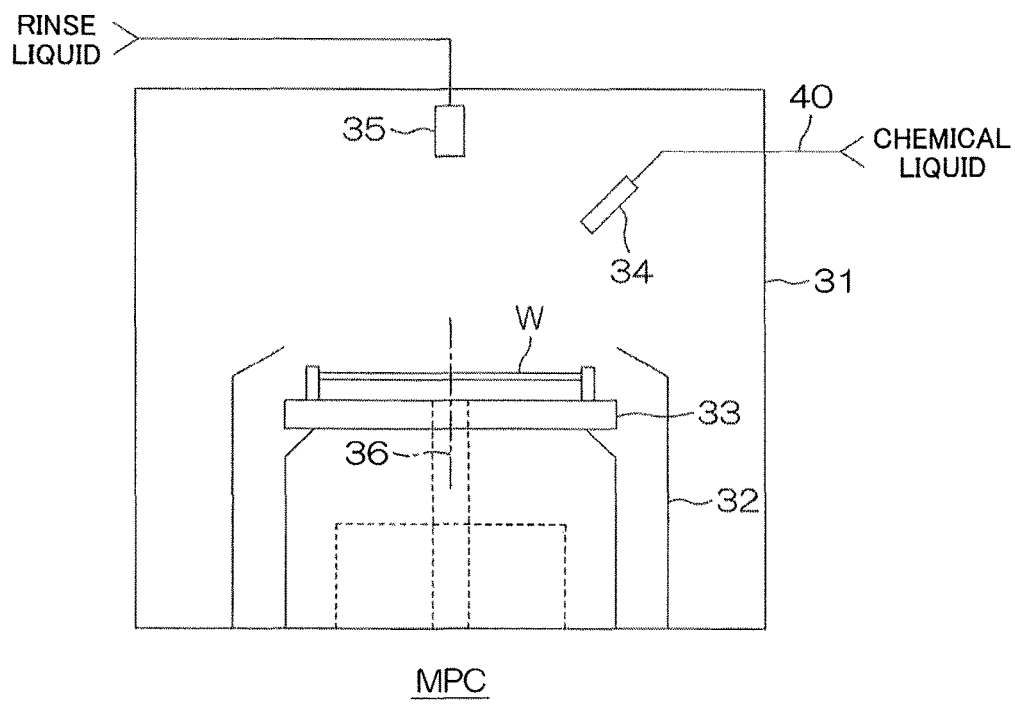
FIG. 3 is an illustrative sectional view for describing an arrangement example of a processing unit included in the substrate processing apparatus.

FIG. 3 is an illustrative sectional view for describing an arrangement example of a processing unit MPC. This processing unit MPC is a front surface cleaning unit that cleans a front surface of a substrate by a chemical liquid. The processing unit MPC includes a processing chamber 31, a processing cup 32, disposed inside the processing chamber 31, a spin chuck 33, disposed inside the processing cup 32, a chemical liquid nozzle 34, supplying the chemical liquid to the substrate W, and a rinse liquid nozzle 35, supplying a rinse liquid (pure water, etc.) to the substrate W. The spin chuck 33 is arranged to hold the single substrate W, which is to be processed, in a horizontal orientation and rotate it around a vertical rotational axis 36. The chemical liquid nozzle 34 and the rinse liquid nozzle 35 are disposed inside the processing chamber 31 and discharge the chemical liquid and rinse liquid, respectively, toward an upper surface of the substrate W held by the spin chuck 33. The chemical liquid from the corresponding chemical liquid cabinet CC is supplied via a chemical liquid supply piping 40 to the chemical liquid nozzle 34.

With such an arrangement, a chemical liquid processing of supplying the chemical liquid to the upper surface of the substrate W to process the upper surface of the substrate W by the chemical liquid, a rinse processing of rinsing off the chemical liquid on the upper surface of the substrate W by the rinse liquid, and a spin drying processing of spinning off liquid droplets on the substrate W by a centrifugal force can be executed.

Figure 4:
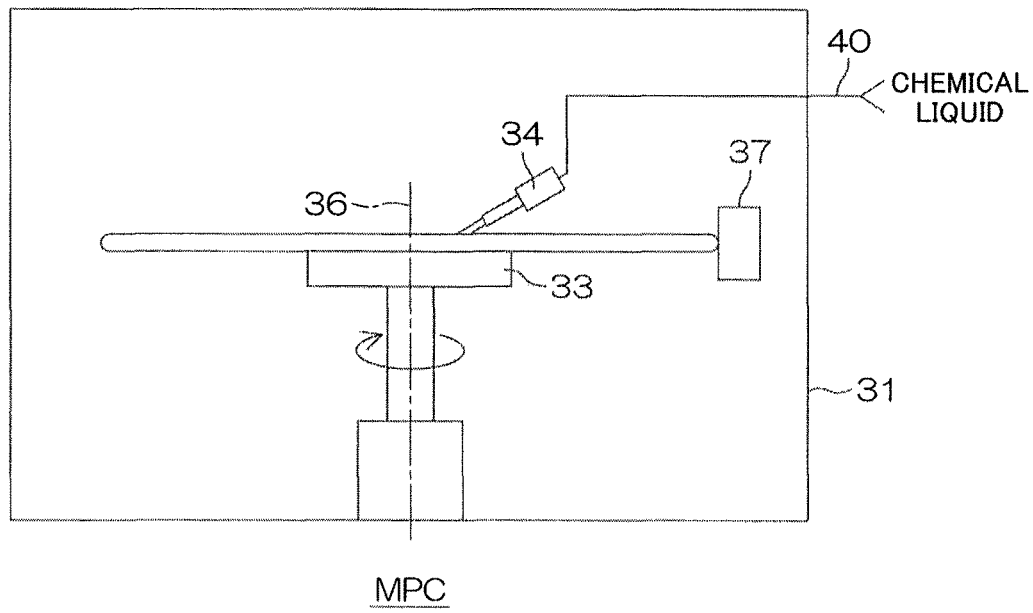
FIG. 4 is an illustrative sectional view for describing another arrangement example of a processing unit included in the substrate processing apparatus.

FIG. 4 is an illustrative sectional view for describing another arrangement example of a processing unit MPC. For comparison, the same reference symbols are attached to portions corresponding to those in FIG. 3. This processing unit MPC is an end surface cleaning unit that scrub-cleans a peripheral end surface of a substrate W. The processing unit MPC includes a processing chamber 31, a spin chuck 33, disposed inside the processing chamber 31, a chemical liquid nozzle 34, and a scrubbing member 37, which scrub-cleans the end surface of the substrate W. The spin chuck 33 is arranged to hold the single substrate W in a horizontal orientation and rotate it around a vertical rotational axis 36. The chemical liquid nozzle 34 supplies a chemical liquid to a front surface of the substrate W held by the spin chuck 33. The chemical liquid from the corresponding chemical liquid cabinet CC is supplied via a chemical liquid supply piping 40 to the chemical liquid nozzle 34. The scrubbing member 37 contacts the peripheral end surface of the substrate W held by the spin chuck 33. By the substrate W being rotated by rotation of the spin chuck 33, the scrubbing member 37 scrub-cleans the peripheral end surface of the substrate W across its entire perimeter.

Figure 5:
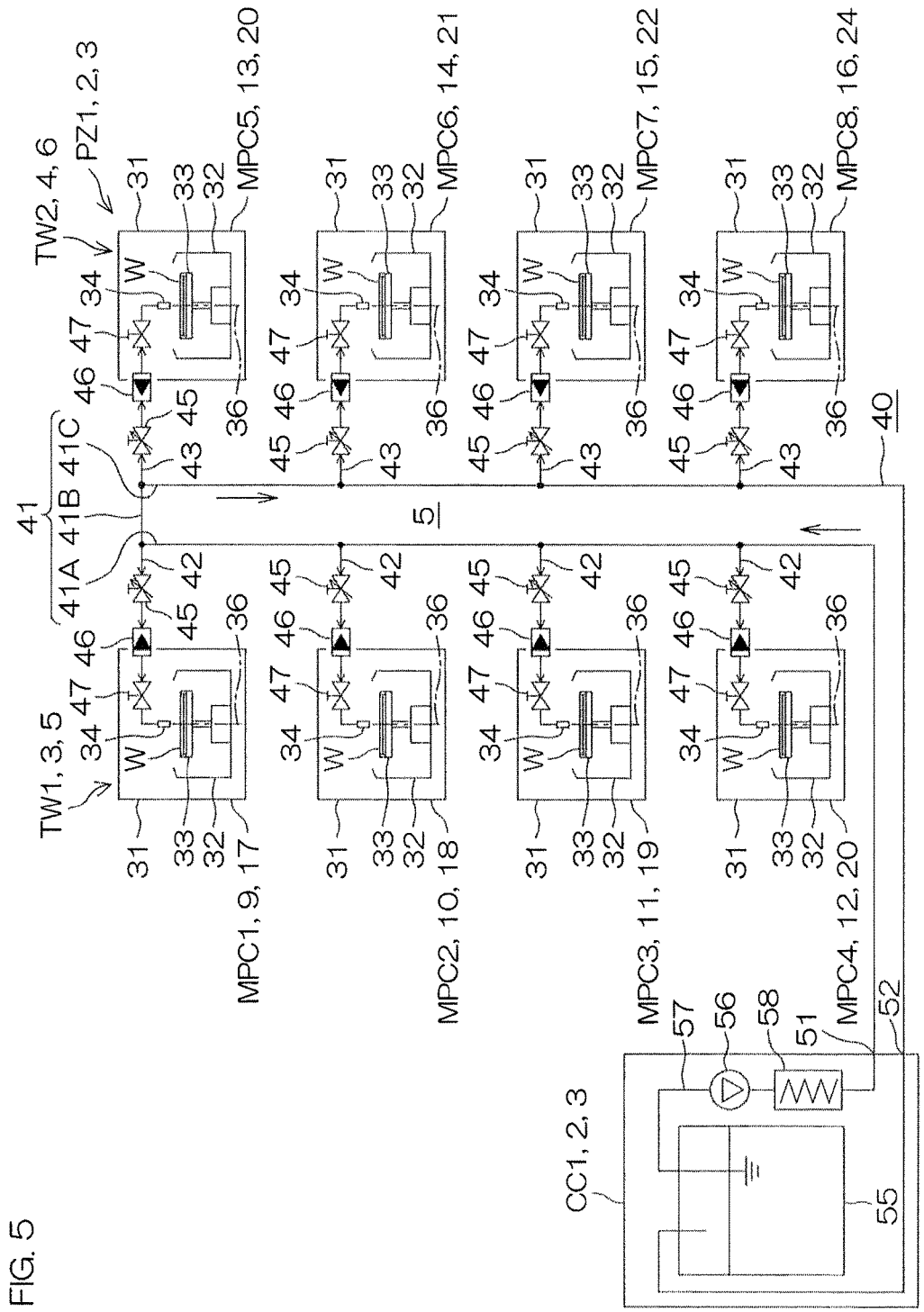
FIG. 5 is a system diagram for describing a chemical liquid piping system inside the substrate processing apparatus.

FIG. 5 is a system diagram for describing a chemical liquid piping system inside the substrate processing apparatus 1. One chemical liquid cabinet CC is provided for each processing zone PZ. The chemical liquid piping system includes the chemical liquid supply piping 40 that supplies the chemical liquid from the chemical liquid cabinet CC to the corresponding processing units MPC.

The chemical liquid supply piping 40 includes a main supply passage 41 disposed in a gate shape across two unit towers TW that constitute a single processing zone PZ. The main supply passage 41 includes a rising portion 41A, made to rise along one of the unit towers TW, a crossing portion 41B, coupled to the rising potion 41A and crossing to the other unit tower TW above the transfer passage 5, and a falling portion 41C, coupled to the crossing portion 41B and falling along the other unit tower TW. An entrance portion of the main supply passage 41 is coupled to a chemical liquid exit 51 of the chemical liquid cabinet CC, and an exit portion of the main supply passage 41 is coupled to a chemical liquid return port of the chemical liquid cabinet CC. The chemical liquid supply piping 40 further includes a plurality of branch supply passages 42, respectively branching from the rising portion 41A to the plurality of processing units MPC constituting the unit tower TW, and a plurality of branch supply passages 43, respectively branching from the falling portion 41C to the plurality of processing units MPC constituting the unit tower TW. A flow control valve 45, a flowmeter 46, and a chemical liquid valve 47 are interposed in each of the branch supply passages 42 and 43. A tip of each of the branch supply passages 42 and 43 is introduced into an interior of a processing unit MPC and coupled to a chemical liquid nozzle 34. The flow control valve 45 is a valve arranged to adjust a flow rate of the chemical liquid flowing through the corresponding branch supply passage 42 or 43. The flowmeter 46 is a device that measures the flow rate of the chemical liquid flowing through the corresponding branch supply passage 42 or 43. The chemical liquid valve 47 is a valve arranged to open/close the corresponding branch supply passage 42 or 43 to thereby control discharge/stoppage of the chemical liquid from the corresponding chemical liquid nozzle 34.

The chemical liquid cabinet CC includes a chemical liquid tank 55, storing the chemical liquid, a pump 56, pumping out the chemical liquid from the chemical liquid tank 55 and pressure-feeding it to the main supply passage 41, and a temperature controller (heater) 58, interposed in a chemical liquid path 57 between the chemical liquid tank 55 and the chemical liquid exit 51. The chemical liquid pumped out from the chemical liquid tank 55 by the pump 56 is supplied to the processing units MPC through the chemical liquid path 57 and the chemical liquid supply piping 40. The chemical liquid that is not used at the processing units MPC returns to the chemical liquid tank 55 through the chemical liquid supply piping 40 and the chemical liquid is thereby circulated. The temperature controller 58 is interposed in this chemical liquid circulation path and therefore the temperature of the chemical liquid inside the chemical liquid tank 55 can be maintained by driving the pump 56 to circulate the chemical liquid. Besides the arrangement using the pump 56, the pressure-feeding of the chemical liquid to the main supply passage 41 may be performed by an arrangement that pressurizes an interior of a sealed type chemical liquid tank 55 by a pressurizing gas (for example, an inert gas, such as nitrogen, etc.).

Figure 6:
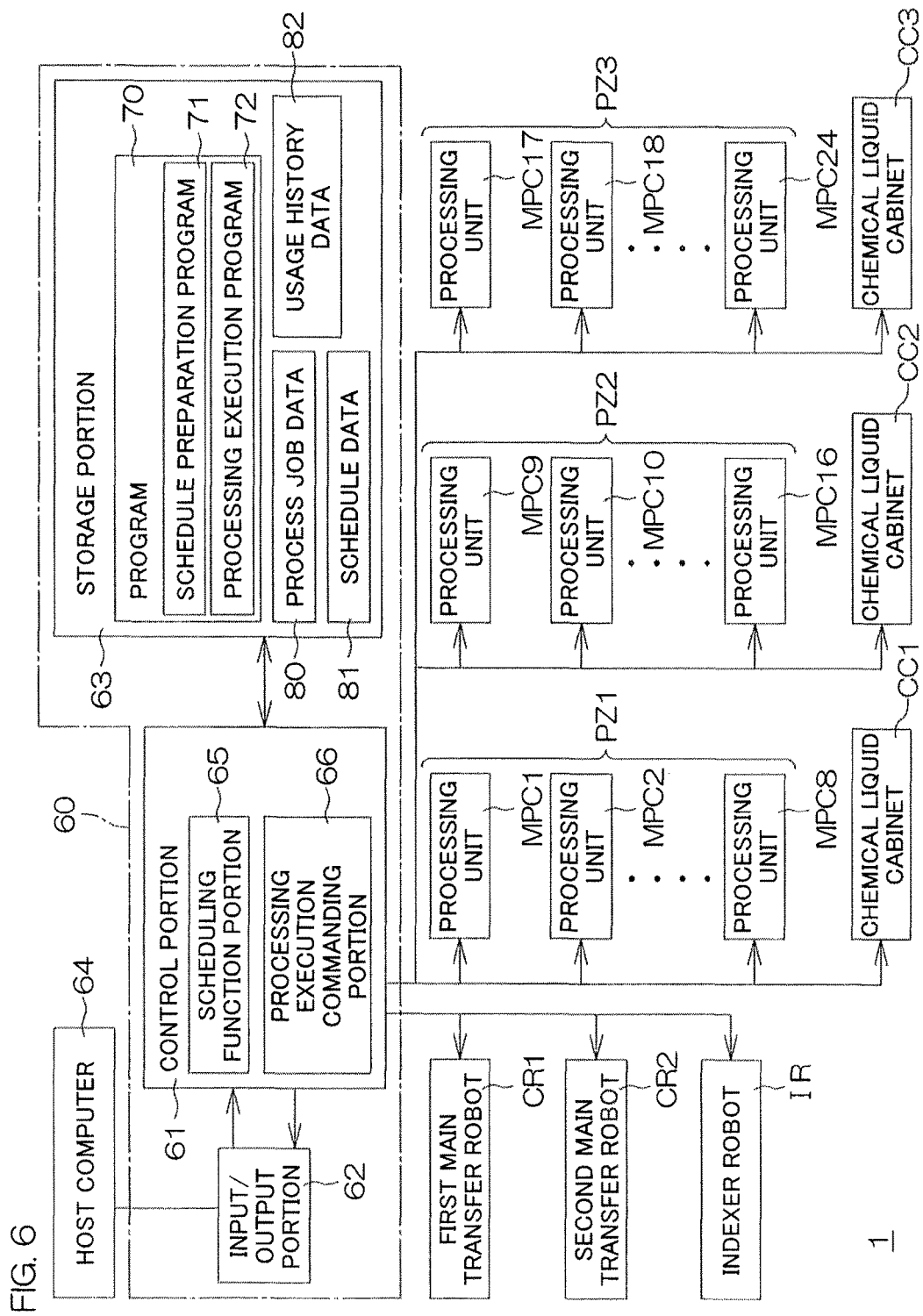
FIG. 6 is a block diagram for describing the electrical arrangement of the substrate processing apparatus.

FIG. 6 is a block diagram for describing the electrical arrangement of the substrate processing apparatus 1. The substrate processing apparatus 1 includes a computer 60 as a controller. The computer 60 controls the processing units MPC1 to MPC8; MPC9 to MPC16; and MPC17 to MPC24, the chemical liquid cabinets CC1, CC2, and CC3, the main transfer robots CR1 and CR2, and the indexer robot IR. The computer 60 may have the form of a personal computer (FA personal computer). The computer 60 includes a control portion 61, an input/output portion 62, and a storage portion 63. The control portion 61 includes a computing unit, such as a CPU, etc. The input/output portion 62 includes output equipment, such as a display unit, etc., and input equipment, such as a keyboard, a pointing device, a touch panel, etc. The input/output portion 62 further includes a communication module arranged to communicate with a host computer 64, which is an external computer. The storage portion 63 includes a storage device, such as a solid-state memory device, a hard-disk drive, etc.

The control portion 61 includes a scheduling function portion 65 and a processing execution commanding portion 66. The scheduling function portion 65 prepares a plan (schedule) by which resources of the substrate processing apparatus 1 are actuated in chronological order to carry out a substrate W from a carrier C, process the substrate W by one or more of the processing units MPC1 to MPC24, and thereafter contain the processed substrate W in the carrier C. The processing execution commanding portion 66 actuates the resources of the substrate processing apparatus 1 in accordance with the schedule prepared by the scheduling function portion 65. The resources are the various units included in the substrate processing apparatus 1 and used for processing substrates and specifically include the processing units MPC1 to MPC24, the indexer robot IR, the main transfer robots CR1 and CR2, the chemical liquid cabinets CC1, CC2, and CC3, and constituent elements of the above.

The storage portion 63 is arranged to store a program 70, executed by the control portion 61, process job data (process job information) 80, received from the host computer 64, schedule data 81, prepared by the scheduling function portion 65, and various data, including usage history data 82 of the processing units MPC and the processing zones PZ, etc.

The program 70 stored in the storage portion 63 includes a schedule preparation program 71, arranged to make the control portion 61 operate as the scheduling function portion 65, and a processing execution program 72, arranged to make the control portion 61 operate as the processing execution commanding portion 66.

The process job data 80 include process job (PJ) codes assigned to respective substrates W and recipes associated with the process job codes. A recipe is a set of data that defines substrate processing contents including a substrate processing condition and a substrate processing procedure. More specifically, a recipe includes substrate type information, parallel processing unit information, usable processing liquid information, processing time information, etc. The substrate type information is information expressing the type of a substrate W to be processed. Specific examples of types of substrates W include a product substrate, which is used for manufacturing a product, a non-product substrate, which is used for maintenance of a processing unit MPC, etc. and is not used to manufacture a product, etc. The parallel processing unit information is information that designates processing units MPC that are capable of being used and expresses that parallel processing by the designated processing units MPC is possible. In other words, a substrate W may be processed by any of the designated processing units. The usable processing liquid information is information designating the type of processing liquid to be used for substrate processing. A specific example is information designating the type of chemical liquid and the temperature of the chemical liquid. The processing time information is the duration of supplying the processing liquid, etc. The usable processing liquid information and the processing time information are example of processing condition information.

For one or a plurality of substrates W on which processing in common is to be performed, the process job refers to that processing. The process job code is identification information (substrate group identification information) for identifying the process job. That is, to a plurality of substrates W that are assigned with a process job code in common, common processing, which is based on the recipe corresponding to the process job code, is applied. For example, when processing in common is applied to a plurality of substrates W that are consecutive in processing order (order of dispensing from a carrier C), a process job code in common is assigned to the plurality of substrates W. However, substrate processing contents (recipes) corresponding to different process job codes may also happen to be the same.

The control portion 61 acquires the process job data for respective substrates W from the host computer 64 via the input/output portion 62 and stores the data in the storage portion 63. The acquisition and storage of the process job data may be performed before execution of scheduling for the respective substrates W. For example, immediately after carriers C are held by the load ports LP1 to LP4, the process job data corresponding to the substrates W contained in the carriers C may be provided from the host computer 64 to the control portion 61. The scheduling function portion 65 plans each process job based on the process job data 80 stored in the storage portion 63 and stores the schedule data 81, expressing the plan, in the storage portion 63. The processing execution commanding portion 66 makes the substrate processing apparatus 1 execute each process job by controlling the indexer robot IR, the main transfer robots CR1 and CR2, the processing units MPC1 to MPC24, and the chemical liquid cabinets CC1, CC2, and CC3 based on the schedule data 81 stored in the storage portion 63.

FIG. 7 is a flowchart for describing a processing example performed by the scheduling function portion 65. More specifically, processing, which is performed repeatedly at a predetermined control cycle by the control portion 61 (computer 60) executing the schedule preparation program 71, is expressed. In other words, a group of steps are incorporated in the schedule preparation program 71 so as to make the computer 60 execute the processing shown in FIG. 7.

The host computer 64 provides the process job data to the control portion 61 and commands the starting of a process job defined by the process job data, that is, the starting of substrate processing (step S1). The control portion 61 receives the process job data and stores the data in the storage portion 63. By using the process job data, the scheduling function portion 65 performs scheduling for executing the process job. The starting of the process job may also be commanded by a worker operating an operation portion of the input/output portion 62.

The scheduling function portion 65 executes scheduling successively for substrates W, corresponding to the process job data, one substrate at a time. First, the scheduling function portion 65 refers the recipe corresponding to the process job data and, based on the parallel processing unit information of the recipe, specifies one or more processing units MPC capable of being used for the processings of the substrates W (step S2). Next, the scheduling function portion 65 executes a processing zone selection processing for selecting one processing zone PZ to be used for substrate processing (step S3). Details of the processing zone selection processing shall be described later.

Next, the scheduling function portion 65 prepares tentative timetables for processing a single substrate W (step S4). For example, suppose that the first processing zone PZ1 is selected in the processing zone selection processing and all of the processing units MPC1 to MPC8 of the first processing zone PZ1 are included in the parallel processing unit information of the recipe corresponding to the process job data. That is, a case where the substrate processing according to the present recipe can be executed at any of the eight processing units MPC1 to MPC8 shall be considered. In this case, there are eight paths through which the substrate W may pass to receive the processing. That is, the paths that can be selected for the processing of the substrate W are the eight paths each of which passes through one of the processing units MPC1 to MPC8. The scheduling function portion 65 then prepares tentative timetables corresponding to the eight paths for the single substrate.

The tentative timetable, corresponding to the path passing through the processing unit MPC1, is shown in FIG. 8A. This tentative timetable includes a block expressing carry-out (Get) of a substrate W from a carrier C by the indexer robot IR, a block expressing carry-in (Put) of the substrate W into the first receiving/passing unit PASS1 by the indexer robot IR, a block expressing carry-out (Get) of the substrate W from the first receiving/passing unit PASS1 by the first main transfer robot CR1, a block expressing carry-in (Put) of the substrate W into the processing unit MPC1 by the first main transfer robot CR1, a processing block expressing processing performed on the substrate W by the processing unit MPC1, a block expressing carry-out (Get) of the processed substrate W from the processing unit MPC1 by the first main transfer robot CR1, a block expressing carry-in (Put) of the substrate W into the first receiving/passing unit PASS1 by the first main transfer robot CR1, a block expressing carry-out (Get) of the substrate W from the first receiving/passing unit PASS1 by the indexer robot IR, and a block expressing carry-in (Put) of the substrate W into a carrier C by the indexer robot IR. The scheduling function portion 65 prepares the tentative timetable by successively positioning the above blocks so as not to overlap with each other on the time axis. Further, the tentative timetable of FIG. 8A includes a chemical liquid supplying block, expressing supplying of the chemical liquid from the first chemical liquid cabinet CC1, in a predetermined chemical liquid processing period within the period in which the processing block is positioned.

Although unillustrated, the scheduling function portion 65 prepares, for the same substrate W, similar tentative timetables corresponding to paths respectively passing through the processing units MPC2 to MPC8 (tentative timetables in which the processing block is positioned at each of the processing units MPC2 to MPC8). The tentative timetables for the total of eight paths are thereby prepared for the single substrate W.

The prepared tentative timetables are stored in the storage portion 63 as a portion of the scheduling data 81. At the stage of preparing the tentative timetables, interference (overlapping on the time axis) with a block related to another substrate W is not considered.

Upon finishing the preparation of all of the tentative timetables corresponding to the single substrate W (step S5), the scheduling function portion 65 executes main scheduling (steps S6 to S9). The main scheduling refers to the positioning of the blocks of the prepared tentative timetables on the time axis so as not to overlap with other blocks of the respective resources. However, each chemical liquid cabinet CC has the ability to supply the chemical liquid to all of the processing units MPC of the corresponding processing zone PZ and therefore overlapping positioning of the chemical liquid supplying block is permitted in regard to the chemical liquid cabinet CC. The schedule data prepared by the main scheduling are stored in the storage portion 63.

To describe even more specifically, the scheduling function portion 65 selects one of the plurality of tentative timetables that have been prepared in correspondence to the substrate W and acquires one block constituting the tentative timetable (step S6). The block that is acquired at this point is the block, among yet-to-be positioned blocks, that is positioned at the earliest position on the time axis of the tentative timetable. Further, the scheduling function portion 65 searches for a position at which the acquired block can be positioned (step S7) and positions the block at the position found by the search (step S8). Each block is positioned at the earliest position on the time axis while avoiding overlapping use of the same resource at the same time. The same operations are executed repeatedly for all blocks constituting the selected tentative timetable (step S9). By all of the blocks constituting the selected tentative timetable being positioned thus, the main scheduling corresponding to that tentative timetable is completed. This main scheduling is executed for all of the prepared tentative timetables (step S10). That is, the main scheduling is executed, for all cases, in other words, the eight cases of processing the substrate W by the processing units MPC1 to MPC8 with the possibility of processing the substrate W.

When the eight cases of main scheduling are finished, a unit selection processing is performed (step S11). In the unit selection processing, one case of main scheduling, that is, a case of main scheduling passing through one processing unit MPC is selected and the processing unit MPC that processes the single substrate W is thereby selected. In the unit selection processing, the one case of main scheduling with which the time at which the substrate W is returned to the carrier C upon processing is the earliest is selected (step S11). If there are present a plurality of cases of main scheduling that are the same in the time at which the substrate W is returned to the carrier C (step S12: YES), the main scheduling using the processing unit MPC, with which a usage interval from the previous usage is the longest, that is, the processing unit MPC, for which a unit final usage time is the oldest, is selected (step S13). The processing unit MPC can thereby be selected so that the processing units MPC within a single processing zone PZ are used uniformly. If there are present a plurality of cases of main scheduling that are the same in the unit final usage time (step S14: YES), the main scheduling using the processing unit MPC of low number (that is, with a high priority order assigned in advance) is selected (step S15).

When one case of main scheduling corresponding to one tentative timetable is thus selected, the scheduling for the single substrate W is completed. The scheduling data expressing the selected main scheduling is then stored in the storage portion 63. The processing execution commanding portion 66 starts actual processing of the substrate W at any timing thereafter (step S20). That is, a substrate transferring operation of carrying out a substrate W from a carrier C by means of the indexer robot IR and transferring the substrate W to a processing unit MPC by means of the main transfer robots CR1 and CR2 is started.

Upon completing the scheduling for the single substrate W, the scheduling function portion 65 registers, in the storage portion 63, the unit final usage time of the processing unit MPC that processes that substrate W (step S19). Further, in the processing zone PZ to which the processing unit MPC belongs, the scheduling function portion 65 checks the unit final usage times of the other processing units MPC, and registers the earliest time, among the unit final usage times of the processing units MPC belonging to that processing zone PZ, as a zone final usage time in the storage portion 63 (step S17). Yet further, the scheduling function portion 65 determines a usage rate (zone usage rate) of the processing zone PZ to which the processing unit MPC belongs, and registers it in the storage portion 63 (step S18). The unit final usage time, the zone final usage time, and the zone usage rate constitute an example of the usage history data 82.

The same operations are executed successively for all substrates W constituting the process job (step S19).

If in the processing zone selection processing (step S3), the second processing zone PZ2 is selected, the scheduling function portion 65 prepares, for a single substrate W, tentative timetables corresponding to paths respectively passing through the processing units MPC9 to MPC16 (tentative timetables in which a processing block is positioned at each of the processing units MPC9 to MPC16). The tentative timetables for a total of eight paths are thereby prepared for the single substrate W. The tentative timetable, corresponding to the path passing through the processing unit MPC9, is shown in FIG. 8B. This tentative timetable includes a block expressing carry-out (Get) of a substrate W from a carrier C by the indexer robot IR, a block expressing carry-in (Put) of the substrate W into the first receiving/passing unit PASS1 by the indexer robot IR, a block expressing carry-out (Get) of the substrate W from the first receiving/passing unit PASS1 by the first main transfer robot CR1, a block expressing carry-in (Put) of the substrate W into the second receiving/passing unit PASS2 by the first main transfer robot CR1, a block expressing carry-out (Get) of the substrate W from the second receiving/passing unit PASS2 by the second main transfer robot CR2, a block expressing carry-in (Put) of the substrate W into the processing unit MPC9 by the second main transfer robot CR2, a processing block expressing processing performed on the substrate W by the processing unit MPC9, a block expressing carry-out (Get) of the processed substrate W from the processing unit MPC9 by the second main transfer robot CR2, a block expressing carry-in (Put) of the substrate W into the second receiving/passing unit PASS2 by the second main transfer robot CR2, a block expressing carry-out (Get) of the substrate W from the second receiving/passing unit PASS2 by the first main transfer robot CR1, a block expressing carry-in (Put) of the substrate W into the first receiving/passing unit PASS1 by the first main transfer robot CR1, a block expressing carry-out (Get) of the substrate W from the first receiving/passing unit PASS1 by the indexer robot IR, and a block expressing carry-in (Put) of the substrate W into a carrier C by the indexer robot IR. The scheduling function portion 65 prepares the tentative timetable by successively positioning the above blocks so as not to overlap with each other on the time axis. Further, the tentative timetable of FIG. 8B includes a chemical liquid supplying block, expressing supplying of the chemical liquid from the second chemical liquid cabinet CC2, in a predetermined chemical liquid processing period within the period in which the processing block is positioned.

Figure 8C:
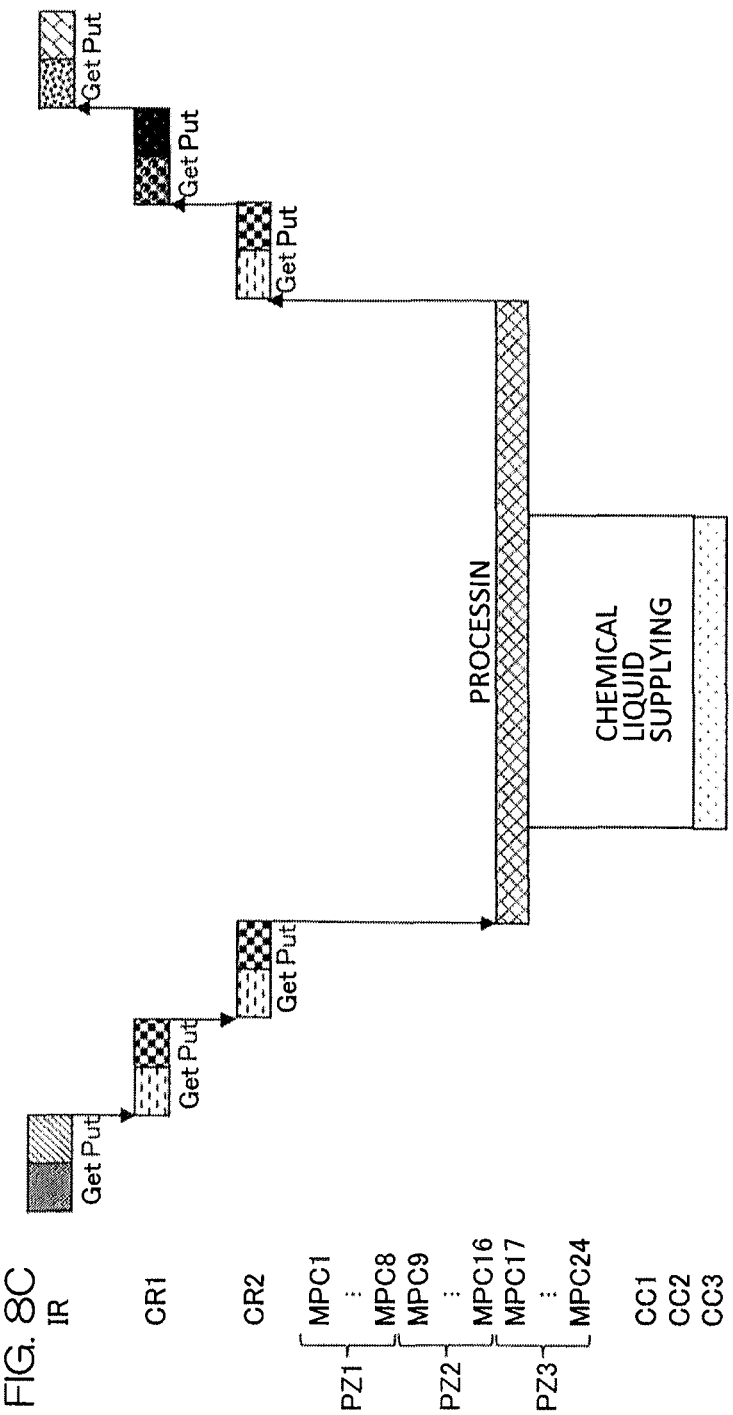

If in the processing zone selection processing (step S3), the third processing zone PZ3 is selected, the scheduling function portion 65 prepares, for a single substrate W, tentative timetables corresponding to paths respectively passing through the processing units MPC17 to MPC24 (tentative timetables in which a processing block is positioned at each of the processing units MPC17 to MPC24). The tentative timetables for a total of eight paths are thereby prepared for the single substrate W. The tentative timetable, corresponding to the path passing through the processing unit MPC17, is shown in FIG. 8C. This tentative timetable is substantially the same as the tentative timetable of FIG. 8B. However it differs in the point of passing through the processing unit MPC17 and in the point that the chemical liquid supplying block, expressing the supplying of the chemical liquid, is positioned for the third chemical liquid cabinet CC3.

FIG. 9 is a flowchart for describing an example of the processing zone selection processing (step S3 of FIG. 7). Also, FIG. 10A and FIG. 10B, FIG. 11A to FIG. 11E, and FIG. 12A to FIG. 12F show examples of the usage history data stored in the storage portion 63 in relation to the processing zone selection processing.

The processing zone selection processing is designed so that a processing zone PZ is selected such that the plurality of processing zones PZ are used uniformly.

As shown in FIG. 10A, processing zone data, expressing settings of the processing zone PZ, are registered in the storage portion 63 for all of the processing units MPC. In the present example, the processing zone data "1," expressing belonging to the first processing zone PZ1, is registered for the processing units MPC1 to MPC8. Also, the processing zone data "2," expressing belonging to the second processing zone PZ2, is registered for the processing units MPC9 to MPC16. Further, the processing zone data "3," expressing belonging to the third processing zone PZ3, is registered for the processing units MPC17 to MPC24. If any of the processing units MPC cannot be used for substrate processing due to maintenance, etc., data expressing ineffectiveness (for example, data expressing "in maintenance," etc.) is registered in place of data (a number) identifying the processing zone PZ. Maintenance refers, for example, to cleaning of the processing unit MPC, etc., that is planned periodically.

On the other hand, as shown in FIG. 11A to FIG. 11E and FIG. 12A to FIG. 12F, the zone usage rates and the zone final usage times of the respective processing zones PZ are registered as usage history data 82 in the storage portion 63.

In selecting the processing zone PZ in which the respective substrates W are to be processed, the scheduling function portion 65 judges, based on the processing zone data, which processing zone PZ the respective processing units MPC belong to, and whether or not an ineffective processing unit MPC is present (step S31 of FIG. 9). The scheduling function portion 65 then reads the zone usage rates from the storage portion 63 and selects the processing zone PZ of the lowest zone usage rate (step S33). If there are present a plurality of processing zones PZ of the lowest zone usage rate (step S32: YES), the scheduling function portion 65 selects the processing zone PZ of the oldest zone final usage time (step S35). If there are present a plurality of processing zones PZ of the oldest zone final usage time (step S34: YES), the scheduling function portion 65 selects the processing zone PZ with a zone number that is the lowest (that is, of the highest priority order assigned in advance) (step S36).

FIG. 11A to FIG. 11E show an example of transition of the usage history data 82 inside the storage portion 63 in a case where, as shown in FIG. 10A, all processing units MPC1 to MPC24 are usable (effective) and all processing units MPC1 to MPC24 are designated as parallel processing units in the recipe designated by the process job data.

As shown in FIG. 11A, in an initial state, the zone usage rates of the first to third processing zones PZ1, PZ2, and PZ3 are all zero and an initial value (for example, "0") is registered as each of the zone final usage times. For example, when the main scheduling for processing a single substrate W using some processing unit MPC of the first processing zone PZ1 is completed, the scheduling function portion 65 registers significant values, differing from the initial values, as the zone usage rate and the zone final usage time of the first processing zone PZ1 as shown in FIG. 11B. The processing zone usage rate may, for example, be a value obtained by dividing a time required for processing of the substrate W by the number of effective (usable) processing units MPC in the corresponding processing zone PZ. More specifically, in a case where substrate processing that takes 120 seconds is planned for one processing unit MPC in the first processing zone PZ1, since the number of effective processing units in the first processing zone PZ1 is 8, the zone usage rate is 15 (=120/8) if there is no substrate processing plan that has not been executed to completion for the other processing units MPC. Upon planning the processing of a single substrate W using a certain processing unit MPC, the scheduling function portion 65 calculates the zone usage rate and registers it in the storage portion 63, estimates the time at which the processing at that processing unit MPC finishes, and registers the estimated time as the unit final usage time in the storage portion 63. The unit final usage time is a portion of the usage history data 82 and is used in the judgment at step S13 of FIG. 7. Further, the scheduling function portion 65 registers, for each processing zone PZ, the latest of the unit final usage times of the processing units MPC belonging to the corresponding processing zone PZ as the zone final usage time in the storage portion 63.

When processing of a second substrate W is planned, the zone usage rates of the second and third processing zones PZ2 and PZ3 are both of the initial value "0" (minimum value) and the zone final usage times of the second and third processing zones PZ2 and PZ3 are both of the initial value "0" (oldest value) as shown in FIG. 11B. The second processing zone PZ2, which is lower in number, is thus selected. When planning of processing of the second substrate W at a processing unit MPC of the second processing zone PZ2 is finished, the scheduling function portion 65 registers significant values, differing from the initial values, as the zone usage rate and the zone final usage time of the second processing zone PZ2 as shown in FIG. 11C. An example where processing that takes 120 seconds is planned for some processing unit MPC in the second processing zone PZ2 and the number of effective processing units in the second processing zone PZ2 is 8 is shown in FIG. 11C, and the zone usage rate of the second processing zone PZ2 is 15 (=120/8).

When processing of a third substrate W is planned, the zone usage rate of the third processing zone PZ3 is of the initial value "0" (minimum value) as shown in FIG. 11C. The third processing zone PZ3 is thus selected. When planning of processing of the third substrate W at a processing unit MPC of the third processing zone PZ3 is finished, the scheduling function portion 65 registers significant values, differing from the initial values, as the zone usage rate and the zone final usage time of the third processing zone PZ3 as shown in FIG. 11D. An example where processing that takes 120 seconds is planned for some processing unit MPC in the third processing zone PZ3 and the number of effective processing units in the third processing zone PZ3 is 8 is shown in FIG. 11D, and the zone usage rate of the third processing zone PZ3 is 15 (=120/8).

When processing of a fourth substrate W is planned, the zone usage rates of the first to third processing zones PZ1, PZ2, and PZ3 are all of the minimum value "15" as shown in FIG. 11D. The first processing zone PZ1, for which the zone final usage time is the oldest, is thus selected. When planning of processing of the fourth substrate W at a processing unit MPC of the first processing zone PZ1 is finished, the scheduling function portion 65 renews the zone usage rate and the zone final usage time of the first processing zone PZ1 as shown in FIG. 11E. An example where processing that takes 120 seconds is planned for some processing unit MPC in the first processing zone PZ1 and the number of effective processing units in the first processing zone PZ1 is 8 is shown in FIG. 11E. In this case, the zone usage rate increases by only 15 (=120/8) and becomes 30.

When processing of a substrate W that has been planned in advance is completed, the zone usage rate is decreased by only the amount added in regard to that substrate W. In the example described above, the zone usage rate of the first processing zone PZ1 changes from 0 to 15 by the planning of substrate processing using, for example, the processing unit MPC1 of the first processing zone PZ1 in FIG. 11B, and the zone usage rate of the first processing zone PZ1 increases from 15 to 30 by the planning of substrate processing using, for example, the processing unit MPC2 of the first processing zone PZ1 in FIG. 11E. Thereafter, when substrate processing at the processing unit MPC1 is completed before processing of yet another substrate W is planned for the first processing zone PZ1, the scheduling function portion 65 decrease the zone usage rate of the first processing zone PZ1 by only 15 to decrease it from 30 to 15.

FIG. 12A to FIG. 12F show a transition of the usage history data 63 in the interior of the storage portion 63 in a case where, as shown in FIG. 10B, the processing units MPC5 to MPC8, which are a portion of the first processing zone PZ1, are made ineffective (unusable) due to maintenance and all of the rest of the processing units MPC are usable (effective). As in the case described above, a case is assumed where all processing units MPC1 to MPC24 are designated as parallel processing units in the recipe designated by the process job data.

As shown in FIG. 12A, in the initial state, the zone usage rates of the first to third processing zones PZ1, PZ2, and PZ3 are all zero and the initial value (for example, "0") is registered as each of the zone final usage times. For example, when the scheduling for processing a single substrate W using some processing unit MPC of the first processing zone PZ1 is completed, the scheduling function portion 65 registers significant values, differing from the initial values, as the zone usage rate and the zone final usage time of the first processing zone PZ1 as shown in FIG. 12B. More specifically, in a case where substrate processing that takes 120 seconds is planned for one processing unit MPC in the first processing zone PZ1, since the number of effective processing units in the first processing zone PZ1 is 4, the zone usage rate is 30 (=120/4) if there is no substrate processing plan that has not been executed to completion for the other processing units MPC. The scheduling function portion 65 calculates the zone usage rate and registers it in the storage portion 63, estimates the time at which the processing at that processing unit MPC finishes, and registers the estimated time as the unit final usage time in the storage portion 63. Further, the scheduling function portion 65 registers, for each processing zone PZ, the latest of the unit final usage times of the processing units MPC belonging to the corresponding processing zone PZ as the zone final usage time in the storage portion 63.

When processing of a second substrate W is planned, the zone usage rates of the second and third processing zones PZ2 and PZ3 are both of the initial value "0" (minimum value) and the zone final usage times of the second and third processing zones PZ2 and PZ3 are both of the initial value "0" (oldest value) as shown in FIG. 12B. The second processing zone PZ2, which is lower in number, is thus selected. When planning of processing of the second substrate W at a processing unit MPC of the second processing zone PZ2 is finished, the scheduling function portion 65 registers significant values, differing from the initial values, as the zone usage rate and the zone final usage time of the second processing zone PZ2 as shown in FIG. 12C. An example where processing that takes 120 seconds is planned for some processing unit MPC in the second processing zone PZ2 and the number of effective processing units in the second processing zone PZ2 is 8 is shown in FIG. 12C, and the zone usage rate of the second processing zone PZ2 is 15 (=120/8).

When processing of a third substrate W is planned, the zone usage rate of the third processing zone PZ3 is of the initial value "0" (minimum value) as shown in FIG. 12C. The third processing zone PZ3 is thus selected. When planning of processing of the third substrate W at a processing unit MPC of the third processing zone PZ3 is finished, the scheduling function portion 65 registers significant values, differing from the initial values, as the zone usage rate and the zone final usage time of the third processing zone PZ3 as shown in FIG. 12D. An example where processing that takes 120 seconds is planned for some processing unit MPC in the third processing zone PZ3 and the number of effective processing units in the third processing zone PZ3 is 8 is shown in FIG. 12D, and the zone usage rate of the third processing zone PZ3 is 15 (=120/8).

When processing of a fourth substrate W is planned, the zone usage rates of the second and third processing zones PZ2 and PZ3 are both of the minimum value "15" as shown in FIG. 12D. The second processing zone PZ2, for which the zone final usage time is the oldest, is thus selected. When planning of processing of the fourth substrate W at a processing unit MPC of the second processing zone PZ2 is finished, the scheduling function portion 65 renews the zone usage rate and the zone final usage time of the second processing zone PZ2 as shown in FIG. 12E. An example where processing that takes 120 seconds is planned for some processing unit MPC in the second processing zone PZ2 and the number of effective processing units in the second processing zone PZ2 is 8 is shown in FIG. 12E. In this case, the zone usage rate increases by only 15 (=120/8) and becomes 30.

When processing of a fifth substrate W is planned, the zone usage rate of the third processing zone PZ3 is of the minimum value "15" as shown in FIG. 12E. The third processing zone PZ3 is thus selected. When planning of processing of the fifth substrate W at a processing unit MPC of the third processing zone PZ3 is finished, the scheduling function portion 65 renews the zone usage rate and the zone final usage time of the third processing zone PZ3 as shown in FIG. 12F. An example where processing that takes 120 seconds is planned for some processing unit MPC in the third processing zone PZ3 and the number of effective processing units in the third processing zone PZ3 is 8 is shown in FIG. 12F. In this case, the zone usage rate increases by only 15 (=120/8) and becomes 30.

FIG. 13A to FIG. 13D show an example of scheduling. In the present example, a case is assumed where the process job data, provided from the host computer 64, specify application of a recipe, designating the processing units MPC1 to MPC24 as parallel processing units, to process six substrates W1 to W6.

Figure 13A:
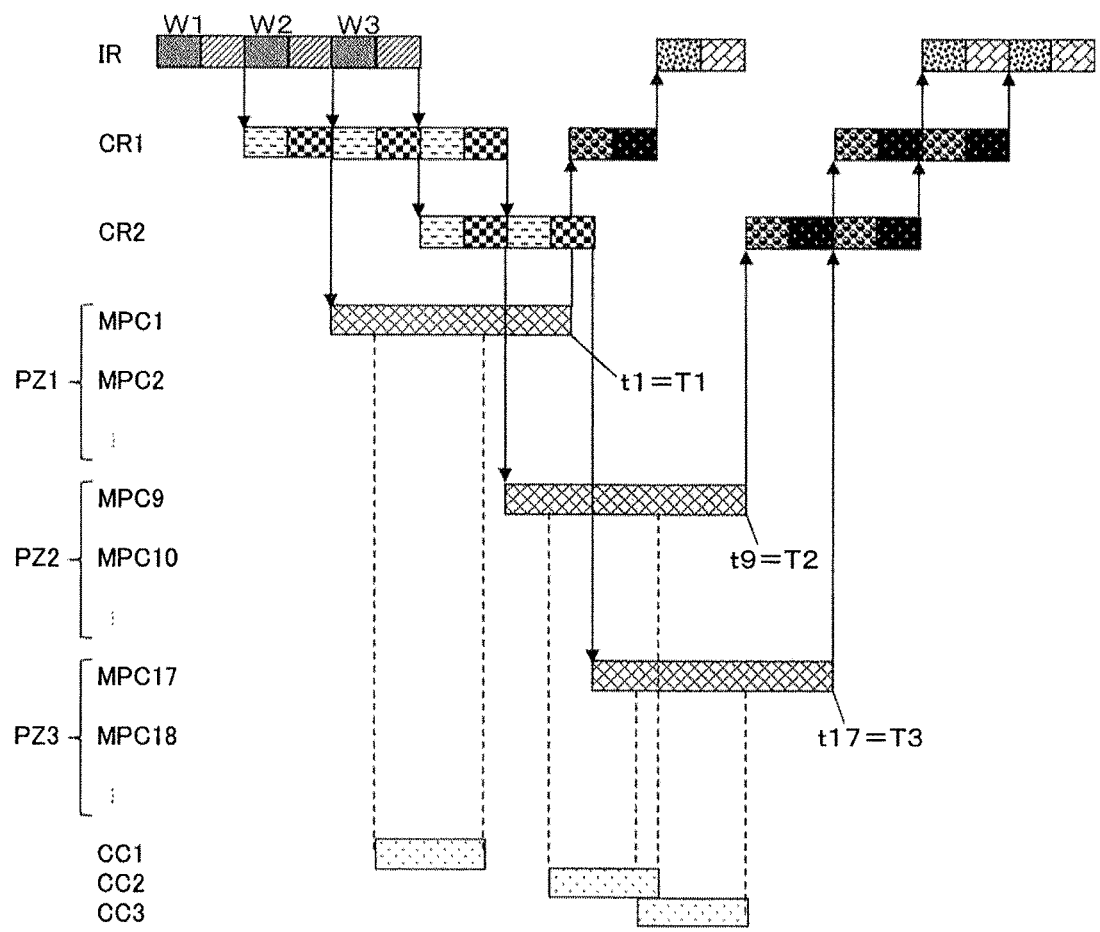

When processing of the first substrate W1 is planned, the zone usage rates of the first to third processing zones PZ1, PZ2, and PZ3 are all zero and the zone final usage times of the first to third processing zones PZ1, PZ2, and PZ3 are all of the initial value. The scheduling function portion 65 thus selects the first processing zone PZ1, which is of the lowest number, and prepares eight tentative timetables, respectively expressing eight paths respectively passing through the effective processing units MPC1 to MPC8 in the first processing zone PZ1. The scheduling function portion 65 executes main scheduling for each of the tentative timetables to prepare a plan of processing the first substrate W1 at one processing unit MPC (for example, the processing unit MPC1) (FIG. 13A). If the processing time required by the processing unit MPC1 for the processing of the substrate W1 is 120 seconds, the zone usage rate of the first processing zone PZ1 will be 15 (=120/8). Also, the time at which the processing of the substrate W1 at the processing unit MPC1 finishes is the unit final usage time t1 of the processing unit MPC1 and becomes the zone final usage time T1 of the first processing zone PZ1.

When processing of the second substrate W2 is planned, the zone usage rates of the second and third processing zones PZ2 and PZ3 are both of the minimum value "0" and the zone final usage times of the second and third processing zones PZ2 and PZ3 are both of the initial value. The scheduling function portion 65 thus selects the second processing zone PZ2, which is of the lower number between the two, and prepares eight tentative timetables, respectively expressing eight paths respectively passing through the effective processing units MPC9 to MPC16 in the second processing zone PZ2. The scheduling function portion 65 executes main scheduling for each of the tentative timetables to prepare a plan of processing the second substrate W2 at one processing unit MPC (for example, the processing unit MPC9) (FIG. 13A). If the processing time required by the processing unit MPC9 for the processing of the substrate W2 is 120 seconds, the zone usage rate of the second processing zone PZ2 will be 15 (=120/8). Also, the time at which the processing of the substrate W2 at the processing unit MPC9 finishes is the unit final usage time t9 of the processing unit MPC9 and becomes the zone final usage time T2 of the second processing zone PZ2.

When processing of the third substrate W3 is planned, the zone usage rate of the third processing zones PZ3 is of the minimum value "0." The scheduling function portion 65 thus selects the third processing zone PZ3 and prepares eight tentative timetables, respectively expressing eight paths respectively passing through the effective processing units MPC17 to MPC24 in the third processing zone PZ3. The scheduling function portion 65 executes main scheduling for each of the tentative timetables to prepare a plan of processing the third substrate W3 at one processing unit MPC (for example, the processing unit MPC17) (FIG. 13A). If the processing time required by the processing unit MPC17 for the processing of the substrate W3 is 120 seconds, the zone usage rate of the third processing zone PZ3 will be 15 (=120/8). Also, the time at which the processing of the substrate W3 at the processing unit MPC17 finishes is the unit final usage time t17 of the processing unit MPC17 and becomes the zone final usage time T3 of the third processing zone PZ3.

Figure 13B:
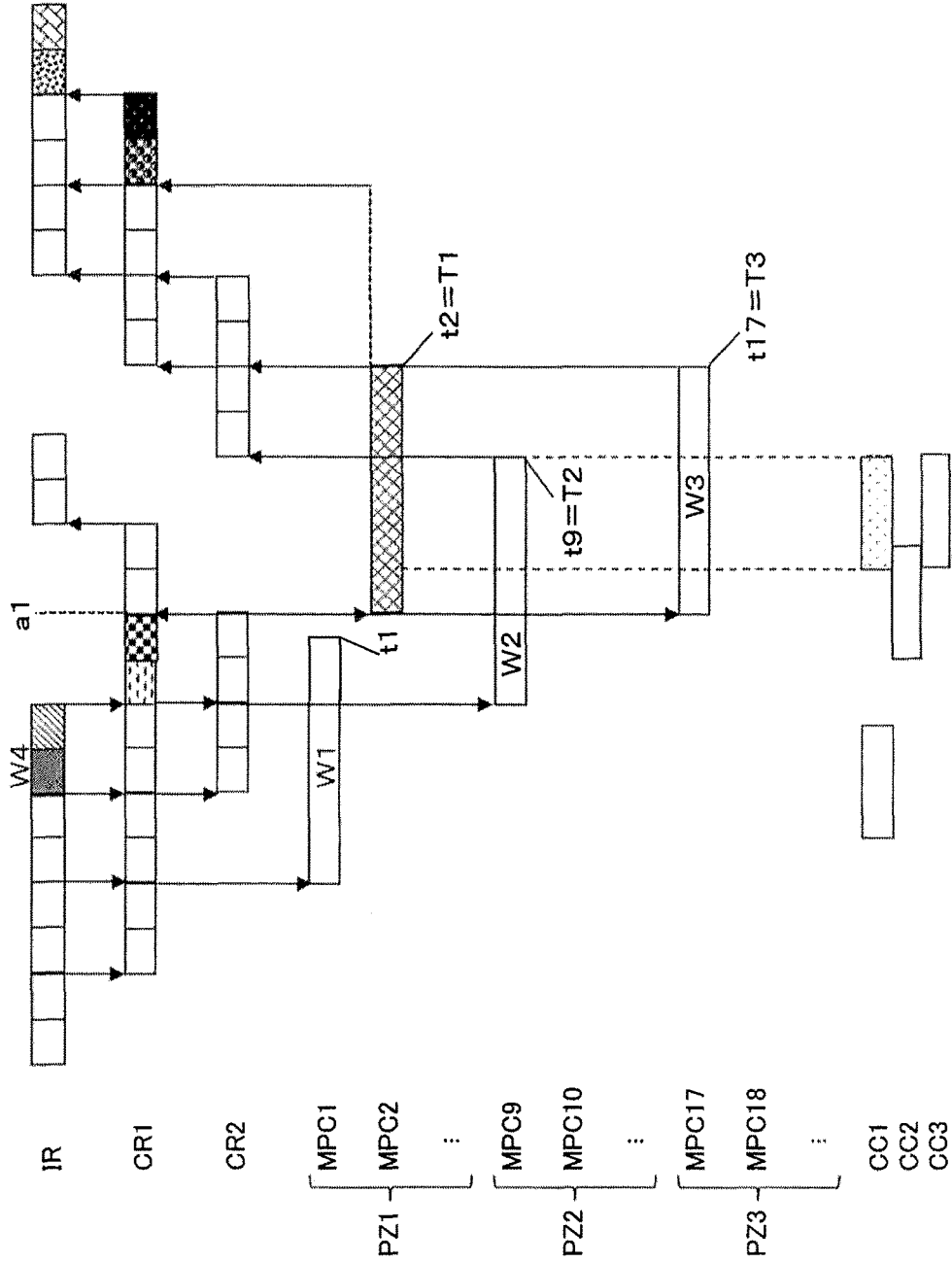

When processing of the fourth substrate W4 (see FIG. 13B) is planned, the zone usage rates of the first to third processing zones PZ1, PZ2, and PZ3 are all 15 and equal. The scheduling function portion 65 thus compares the zone final usage times T1, T2, and T3 of the first to third processing zones PZ1, PZ2, and PZ3, and selects the first processing zone PZ1 corresponding to the oldest zone final usage time T1 (see FIG. 13A). Further, the scheduling function portion 65 prepares eight tentative timetables, respectively expressing eight paths respectively passing through the effective processing units MPC1 to MPC8 in the first processing zone PZ1. The scheduling function portion 65 executes main scheduling for each of the tentative timetables to select one processing unit MPC. In the example of FIG. 13B, at a time a1 at which the first main transfer robot CR1 can carry in the substrate W4, none of the processing units MPC1 to MPC8 of the first processing zone PZ1 is processing a substrate W and therefore processing of the substrate W4 may be planned at any of the processing units MPC1 to MPC8 and these are also practically the same in estimated substrate processing finishing time (time at which the substrate W4 is returned to a carrier C). On the other hand, whereas the unit final usage time t1 of the processing unit MPC1 is of a significant value other than the initial value, the unit final usage times of the other processing units MPC2 to MPC8 are all of the initial value. The scheduling function portion 65 thus selects the main scheduling using the tentative timetable passing through the processing unit MPC2, which, among the processing units MPC2 to MPC8, is of the lowest number, and prepares a plan of processing the fourth substrate W4 at the processing unit MPC2. If the processing time required by the processing unit MPC2 for the processing of the substrate W4 is 120 seconds, the zone usage rate of the first processing zone PZ1 increases by only 15 (=120/8) and becomes 30. This is because at the point at which the processing of the substrate W4 is being planned, the substrate processing at the processing unit MPC1 is not completed. The time at which the processing of the substrate W4 at the processing unit MPC2 finishes is the unit final usage time t2 of the processing unit MPC2 and since this is a time later than the unit final usage time t1, the zone final usage time T1 of the first processing zone PZ1 becomes t2 (T1=t2).

When processing of the fifth substrate W5 (see FIG. 13C) is planned, the zone usage rate of the first processing zone PZ1 is 30 and the zone usage rates of the second and third processing zones PZ2 and PZ3 are both 15 and equal. The scheduling function portion 65 thus compares the zone final usage times T2 and T3 of the second and third processing zones PZ2 and PZ3, and selects the second processing zone PZ2 corresponding to the oldest zone final usage time T2 (see FIG. 13B). Further, the scheduling function portion 65 prepares eight tentative timetables, respectively expressing eight paths respectively passing through the effective processing units MPC9 to MPC16 in the second processing zone PZ2. The scheduling function portion 65 executes main scheduling for each of the tentative timetables to select one processing unit MPC. In the example of FIG. 13C, at a time a2 at which the second main transfer robot CR2 can carry in the substrate W5, none of the processing units MPC9 to MPC15 of the second processing zone PZ2 is processing a substrate W and therefore processing of the substrate W5 may be planned at any of the processing units MPC9 to MPC15, and these are also practically the same in estimated substrate processing finishing time (time at which the substrate W5 is returned to a carrier C). On the other hand, whereas the unit final usage time t9 of the processing unit MP9 is of a significant value other than the initial value, the unit final usage times of the other processing units MPC10 to MPC16 are all of the initial value. The scheduling function portion 65 thus selects the main scheduling using the tentative timetable passing through the processing unit MPC10, which, among the processing units MPC10 to MPC16, is of the lowest number, and prepares a plan of processing the fifth substrate W5 at the processing unit MPC10. If the processing time required by the processing unit MPC10 for the processing of the substrate W5 is 120 seconds, the zone usage rate of the second processing zone PZ2 increases by only 15 (=120/8) and becomes 30. This is because at the point at which the processing of the substrate W5 is being planned, the substrate processing at the processing unit MPC9 is not completed. The time at which the processing of the substrate W5 at the processing unit MPC10 finishes becomes the unit final usage time t10 of the processing unit MPC10 and this becomes the zone final usage time T2 of the second processing zone PZ2.

At the point at which processing of the sixth substrate W6 (see FIG. 13D) is planned, the processings of the substrates W1 and W2 at the processing units MPC1 and MPC9 are finished and the substrate processing at the processing units MPC2, MPC10, and MPC17 is not completed. The zone usage rates of the first to third processing zones PZ1, PZ2, and PZ3 are thus all 15 and equal. The scheduling function portion 65 thus compares the zone final usage times T1, T2, and T3 of the first to third processing zones PZ1, PZ2, and PZ3, and selects the third processing zone PZ3 corresponding to the oldest zone final usage time T3 (see FIG. 13C). Further, the scheduling function portion 65 prepares eight tentative timetables, respectively expressing eight paths respectively passing through the effective processing units MPC17 to MPC24 in the third processing zone PZ3. The scheduling function portion executes main scheduling for each of the tentative timetables to select one processing unit MPC. In the example of FIG. 13D, at a time a3 at which the second main transfer robot CR2 can carry in the substrate W6, none of the processing units MPC17 to MPC24 of the third processing zone PZ3 is processing a substrate W and therefore processing of the substrate W6 may be planned at any of the processing units MPC17 to MPC24, and these are also practically the same in estimated substrate processing finishing time (time at which the substrate W6 is returned to a carrier C). On the other hand, whereas the unit final usage time t17 of the processing unit MPC17 is of a significant value other than the initial value, the unit final usage times of the other processing units MPC18 to MPC24 are all of the initial value. The scheduling function portion 65 thus selects the main scheduling using the tentative timetable passing through the processing unit MPC18, which, among the processing units MPC18 to MPC24, is of the lowest number, and prepares a plan of processing the sixth substrate W6 at the processing unit MPC18. If the processing time required by the processing unit MPC18 for the processing of the substrate W6 is 120 seconds, the zone usage rate of the third processing zone PZ3 increases by only 15 (=120/8) and becomes 30. This is because at the point at which the processing of the substrate W6 is being planned, the substrate processing at the processing unit MPC17 is not completed. The time at which the processing of the substrate W6 at the processing unit MPC18 finishes becomes the unit final usage time t18 of the processing unit MPC18 and become the zone final usage time T3 of the third processing zone PZ3.

Figure 14A:
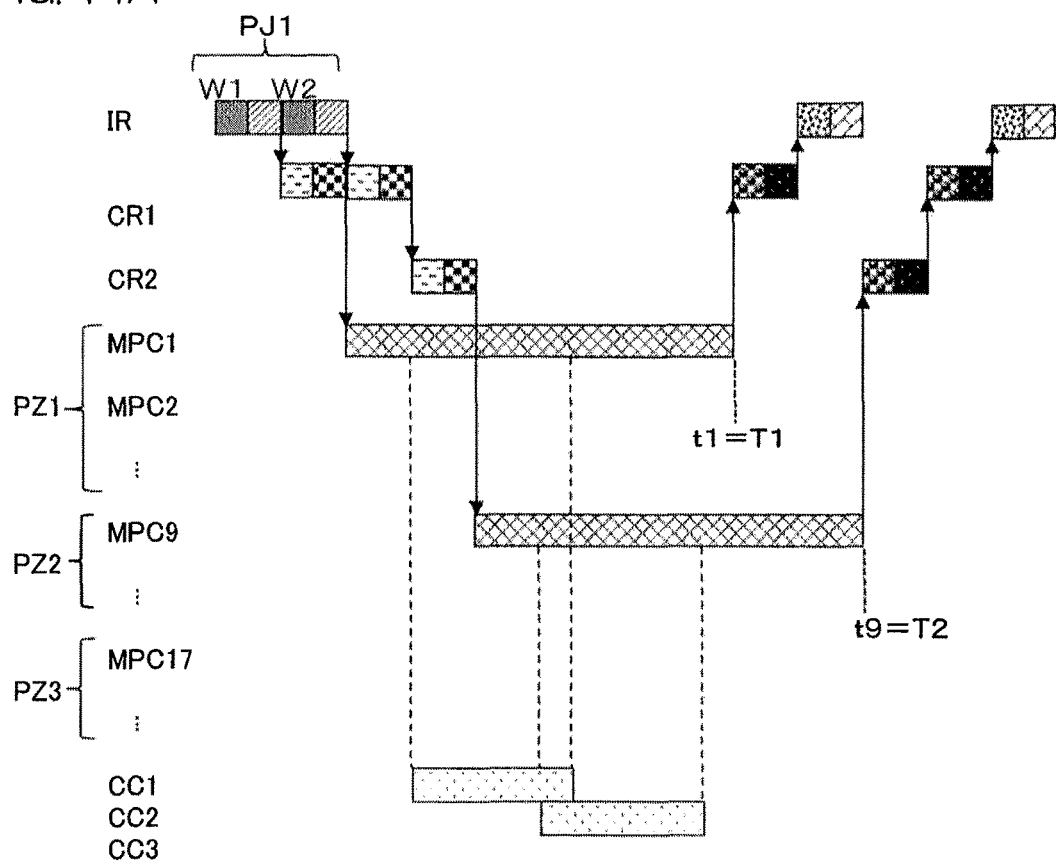

FIG. 14A to FIG. 14C show another example of scheduling and illustrate a case where process jobs PJ1 and PJ2, separated by a time interval and respectively commanding processings of a small number of substrates, are provided. The first process job PJ1 commands application of a recipe that designates parallel processing at the processing units MPC1 to MPC24 for two substrates W1 and W2. Also, the second process job PJ2 commands application of a recipe that designates parallel processing at the processing units MPC1 to MPC24 for two substrates W3 and W4.

Planning related to the substrates W1 and W2 of the first process job PJ1 (see FIG. 14A) is the same as that of the scheduling example of FIG. 13A and description thereof shall thus be omitted.

The second process job PJ2 is provided from the host computer 64 at a time all after completion of the processings of the substrates W1 and W2 (see FIG. 14B). Therefore, at the time all, the zone usage rate is zero not only obviously for the third processing zone PZ3 but also for each of the first and second processing zones PZ1 and PZ2. On the other hand, whereas the zone final usage time of the third processing zone PZ3 is of the initial value, the zone final usage times T1 and T2 of the first and second processing zones PZ1 and PZ2 are both of significant values. The scheduling function portion 65 thus selects the third processing zone PZ3 for processing of the first substrate W3 of the second process job PJ2. Further, the scheduling function portion 65 prepares eight tentative timetables, respectively expressing eight paths respectively passing through the effective processing units MPC17 to MPC24 in the third processing zone PZ3. The scheduling function portion 65 executes main scheduling for each of the tentative timetables to select one processing unit MPC. In the example of FIG. 14B, at a time a12 at which the second main transfer robot CR2 can carry in the substrate W3, none of the processing units MPC17 to MPC24 of the third processing zone PZ3 is processing a substrate W and therefore processing of the substrate W3 may be planned at any of the processing units MPC17 to MPC24, and these are also practically the same in estimated substrate processing finishing time. Also, with all of the processing units MPC17 to MPC24, the unit final usage time is of the initial value. The scheduling function portion 65 thus selects the main scheduling using the tentative timetable passing through the processing unit MPC17, which, among the processing units MPC17 to MPC24, is of the lowest number, and prepares a plan of processing the substrate W3 at the processing unit MPC17. If the processing time required by the processing unit MPC17 for the processing of the substrate W3 is 120 seconds, the zone usage rate of the third processing zone PZ3 becomes 15 (=120/8). The time at which the processing of the substrate W3 at the processing unit MPC17 finishes is the unit final usage time t17 of the processing unit MPC17 and this becomes the zone final usage time T3 of the third processing zone PZ3.

The second process job J2 is provided from the host computer 64 at the time all after completion of the processings of the substrates W1 and W2 and therefore at the point at which processing of the second substrate W4 of the second process job J2 (see FIG. 14C) is planned, the zone usage rates of the first and second processing zones PZ1 and PZ2 are both zero and on the other hand, the zone usage rate of the third processing zone PZ3 is 15. Meanwhile, the zone final usage times T1 and T2 of the first and second processing zones PZ1 and PZ2 are both of significant values and the zone final usage time T1 of the first processing zone PZ1 is older. The scheduling function portion 65 thus selects the first processing zone PZ1 for the processing of the second substrate W4 of the second process job PJ2. Further, the scheduling function portion 65 prepares eight tentative timetables, respectively expressing eight paths respectively passing through the effective processing units MPC1 to MPC8 in the first processing zone PZ1. The scheduling function portion 65 executes main scheduling for each of the tentative timetables to select one processing unit MPC. In the example of FIG. 14C, at a time a13 at which the first main transfer robot CR1 can carry in the substrate W4, none of the processing units MPC1 to MPC8 of the first processing zone PZ1 is processing a substrate W and therefore processing of the substrate W4 may be planned at any of the processing units MPC1 to MPC8, and these are also practically the same in estimated substrate processing finishing time. On the other hand, whereas the unit final usage time t1 of the processing unit MPC1 is of a significant value, the unit final usage times of the other processing units MPC2 to MPC8 are all of the initial value. The scheduling function portion 65 thus selects the main scheduling using the tentative timetable passing through the processing unit MPC2, which, among the processing units MPC2 to MPC8, is of the lowest number, and prepares a plan of processing the substrate W4 at the processing unit MPC2. If the processing time required by the processing unit MPC2 for the processing of the substrate W4 is 120 seconds, the zone usage rate of the first processing zone PZ1 becomes 15 (=120/8). The time at which the processing of the substrate W4 at the processing unit MPC2 finishes becomes the unit final usage time t2 of the processing unit MPC2 and this becomes the zone final usage time T1 of the first processing zone PZ1.

As described above, the substrate processing apparatus 1 of the present preferred embodiment includes the carrier holding unit 2, holding the carriers 2 that contain the substrates W, the plurality of processing units MPC, each processing a substrate W, the indexer robot IR and the first and second main transfer robots CR1 and CR2, transferring the substrates W between the carriers C held by the carrier holding unit 2 and the plurality of processing units MPC, and the computer 60 as the controller. The computer 60 controls the plurality of processing units MPC, the indexer robot IR, and the first and second main transfer robots CR1 and CR2. The computer 60 classifies the plurality of processing units MPC into a plurality of groups in advance. That is, the computer 60 classifies the plurality of processing units MPC according to the transfer path length, that is, the transfer time from the carrier holding portion 2 into the first processing zone PZ1, the second processing zone PZ2, and the third processing zone PZ3. The computer 60 is programmed to execute, when determining a processing unit MPC that is to process a substrate W, the processing zone selection processing (S3; group selection step) of selecting one of the plurality of processing zones PZ, the unit selection processing (S11 to S15; unit selection step) of selecting one processing unit MPC belonging to the one selected processing zone PZ, and a processing (S20) of controlling the indexer robot IR and the first and second main transfer robots CR1 and CR2 to carry a substrate W to be processed into the processing unit MPC selected in the unit selection processing. More specifically, the computer 60 executes the processing zone selection processing (S3) to perform uniform selection among the plurality of processing zones PZ, and executes the unit selection processing (S11 to S15) to perform uniform selection among the plurality of processing units MPC belonging to each processing zone PZ. By the present arrangement, the variation of usage frequency among the plurality of processing units MPC can be reduced.

For example, if priority is placed only on throughput, the processing units MPC that are short in transfer path length or transfer time from the carrier holding portion 2 will be selected with priority, and a large difference may thus arise between the usage frequency of the processing units MPC of the first processing zone PZ1 and the usage frequencies of the processing units MPC of the second and third processing zones PZ2 and PZ3. When a process job includes a processing command to apply a recipe designating parallel processing by all of the processing units MPC for a large number (for example, not less than the number of processing units MPC) of substrates W, all of the processing units MPC will tend to be used uniformly. On the other hand, if process jobs, each commanding the processings of a small number (for example, not more than the number of processing units in the first processing zone PZ1) of substrates W are provided with comparatively long time intervals in between, the usage frequency of the processing units MPC of the first processing zone PZ1 may become high and the usage frequencies of the processing units MPC of the second and third processing zones PZ2 and PZ3 may become low.

Loads applied to mechanism portions, such as the spin chucks 33, etc., and expendable parts, such as the scrubbing members 37, etc., that are included in the processing units MPC of the first processing zone PZ1 will thus increase in comparison to loads applied to mechanism portions and expendable parts of the processing units MPC of the second and third processing zones PZ2 and PZ3. Intervals of maintenance work, such as parts replacement, etc., may thereby become short for the processing units MPC of the first processing zone PZ1. This will adversely influence productivity because operation of the entire substrate processing apparatus 1 must be stopped for such maintenance work. Additionally, influences on substrate processing may occur if expendable parts used for substrate processing undergo early degradation.

Also, a chemical liquid consumption amount of the first chemical liquid cabinet CC1 supplying the chemical liquid to the first processing zone PZ1 will become high and chemical liquid consumption amounts of the second and third chemical liquid cabinets CC2 and CC3 respectively supplying the chemical liquids to the second and third processing zones PZ2 and PZ3 will become low. When such bias arises in the chemical liquid consumption amounts, the chemical liquid of the first chemical liquid cabinet CC1 must be replenished frequently and becomes high in the number of times of chemical liquid replenishment. Moreover, management of chemical liquid replenishment is made difficult due to differences in timings of chemical liquid replenishment at the first to third chemical liquid cabinets CC1, CC2, and CC3. Also, variations arise in degradation of parts, such as the pump 56, etc., and therefore variations also arise in intervals of maintenance work, such as parts replacement, etc., that must be performed on the first to third chemical liquid cabinets CC1, CC2, and CC3. Management of the maintenance work is thereby made difficult.

Yet further, if the processing units MPC of the second and third processing zones PZ2 and PZ3 become long in unused time, the chemical liquids inside the processing units MPC may crystallize and become particles that may have adverse effects on quality of subsequent substrate processing.

Such issues are resolved by the arrangements of the preferred embodiment described above with which the first to third processing zones PZ1, PZ2, and PZ3 are selected uniformly.

Especially with the present preferred embodiment, the substrate transfer unit, which transfers the substrates W between the carriers C and the processing units MPC, includes the first main transfer robot CR1 and the second main transfer robot CR2 that receives and passes a substrate W from and to the first main transfer robot CR1. The first processing zone PZ1 is constituted of the processing units MPC that are accessed directly by the first main transfer robot CR1, and the second processing zone PZ2 and the third processing zone PZ3 are constituted of the processing units MPC that are accessed directly by the second main transfer robot CR2. Both the first and second main transfer robots CR1 and CR2 mediate substrate transfers to the processing units MPC constituting the second and third processing zones PZ2 and PZ3. Comparatively long times are thus required for substrate transfers between the carriers C and the second and third processing zones PZ2 and PZ3. While adopting such an arrangement, substrate processing can be performed using the processing units MPC of the first to the third processing zones PZ1, PZ2, and PZ3 uniformly in the present preferred embodiment. Therefore, even if a large number (24, in the present preferred embodiment) of the processing units MPC are equipped to increase productivity, the large number of processing units MPC can be used uniformly.

Also, the computer 60 selects one processing zone PZ (group) in advance and therefore suffices to select one processing unit MPC within the range of the processing units MPC belonging to the selected processing zone PZ. Therefore when planning processing of a single substrate W, the computer is not required to prepare tentative timetables corresponding to all of the effective processing units MPC and suffices to prepare a small number of tentative timetables corresponding to the effective processing units belonging to the selected processing zone PZ. One processing unit MPC may then be selected by performing judgment on the small number of tentative timetables based on throughput (processing finishing time), unit final usage time, etc. By thus selecting the processing unit MPC in stepwise manner, a computing load of the computer 60 can be lightened, in comparison to a case of regarding all processing units MPC to be equivalent and selecting one processing unit MPC in one step. Accordingly, the time it takes for the computer 60 to select one processing unit MPC can be shortened, so that substrate processing can be started early, and productivity of the substrate processing apparatus 1 can be improved accordingly. The computing load of the computer 60 can thus be suppressed even if a large number of the processing units MPC are equipped to increase productivity.

Further with the present preferred embodiment, the plurality of processing units MPC are classified into the plurality of processing zones PZ (groups) according to each plurality of processing units MPC sharing a chemical liquid cabinet CC. That is, a plurality of processing units MPC sharing a chemical liquid cabinet CC belong to the same processing zone PZ (group) and therefore selecting the processing zones PZ uniformly is equivalent to selecting the chemical liquid cabinets CC uniformly and variation of usage frequency among the plurality of chemical liquid cabinets CC can thereby be reduced readily. Consequently, the frequency of chemical liquid replenishment can be averaged out among the plurality of processing zones PZ, and accordingly, changes with time of the chemical liquid can be made uniform among the plurality of chemical liquid cabinets CC. Variation of processing quality among the plurality of processing units MPC can thereby be suppressed.

Further with the present preferred embodiment, the zone final usage time (group final usage time) is recorded for each processing zone PZ, and the zone which will be used is selected based on the zone final usage time. The processing zones PZ can thus be selected uniformly and the variation of usage frequency among the processing units MPC can be reduced accordingly.

Also with the present preferred embodiment, the zone usage rate (group usage rate), which is the rate of use for substrate processing of the processing units MPC belonging to each processing zone PZ, is calculated, and a processing zone PZ (of the lowest zone usage rate) is selected based on the zone usage rate. Variation of the zone usage rate is thereby reduced and the variation of usage frequency among the processing units MPC is reduced accordingly.

Also with the present preferred embodiment, the unit final usage time of each processing unit MPC is recorded and the processing unit MPC of the oldest unit final usage time is selected with priority. The variation of usage frequency among the processing units MPC in each processing zone PZ can thereby be reduced.

Figure 15A:
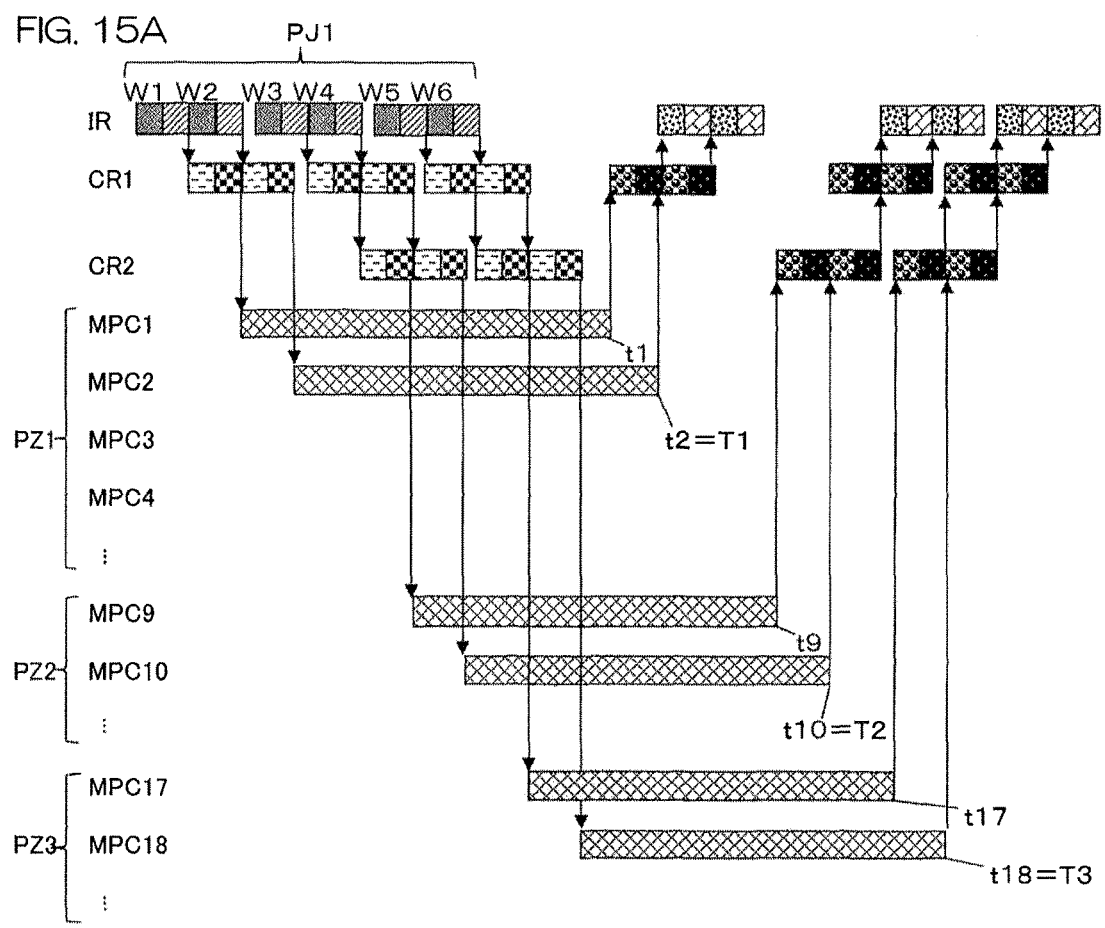
FIG. 15A shows an example of scheduling in a substrate processing apparatus according to another preferred embodiment of the present invention.

FIG. 15A and FIG. 15B show examples of scheduling in a substrate processing apparatus according to another preferred embodiment of the present invention. In the present preferred embodiment, the indexer robot IR has two hands 11 and is capable of transferring two substrates W at the same time. More specifically, the indexer robot IR executes a substrate supplying operation of carrying out two unprocessed substrates from a carrier C held by the carrier holding portion 2 and transferring these at the same time, and placing these on the first receiving/passing unit PASS1, and a substrate housing operation of carrying out two processed substrates W from the first receiving/passing unit PASS1 and transferring these at the same time, and housing these in a carrier C. On the other hand, with the substrate transfer robot constituting each of the first and second main transfer robots CR1 and CR2, each of the pair of advancing/retreating mechanisms has two hands 21 and 22, and a total of four hands 21 and 22 are equipped. The first main transfer robot CR1 executes a substrate carry-in operation of receiving two unprocessed substrates W from the first receiving/passing unit PASS1 and transferring and carrying these respectively into two different processing units MPC inside the first processing zone PZ1 at the same time, a substrate carry-out operation of carrying out two processed substrates W respectively from two different processing units MPC inside the first processing zone PZ1 and transferring and passing these at the same time to the first receiving/passing unit PASS1, a substrate carry-in mediating operation of receiving two unprocessed substrates W from the first receiving/passing unit PASS1 and transferring and passing these at the same time to the second receiving/passing unit PASS2, and a substrate carry-out mediating operation of receiving two processed substrates W from the second receiving/passing unit PASS2 and transferring and passing these at the same time to the first receiving/passing unit PASS1. The second main transfer robot CR2 executes a substrate carry-in operation of receiving two unprocessed substrates W from the second receiving/passing unit PASS2 and transferring and carrying these respectively into two different processing units MPC inside the same processing zone PZ (either the second or the third processing zone PZ2 or PZ3) at the same time and a substrate carry-out operation of carrying out two processed substrates W respectively from two different processing units MPC inside the same processing zone PZ (either the second or the third processing zone PZ2 or PZ3) and transferring and passing these at the same time to the second receiving/passing unit PASS2.

In the examples of FIG. 15A and FIG. 15B, a case is assumed where the data of a process job PJ1, which designates processings of six substrates W1 to W6, are provided from the host computer 64 (FIG. 15A), and then after some time, the data of another process job PJ2 (FIG. 15B), which designates processings of two substrates W7 an W8, are provided from the host computer 64. The data of both process jobs PJ1 and PF2 specify that a recipe designating the processing units MPC1 to MPC24 as parallel processing units be applied.

The scheduling function portion 65 executes planning of substrate processing with two substrates W as a unit.

First, FIG. 15A is referred. When, at a stage where no substrate processing has been planned, processings of the first and second substrates W1 and W2 of the process job PJ1 are planned, the zone usage rates of the first to third processing zones PZ1, PZ2, and PZ3 are all zero and the zone final usage times of the first to third processing zones PZ1, PZ2, and PZ3 are all of the initial value. The scheduling function portion 65 thus selects the first processing zone PZ1, which is of the lowest number. The scheduling function portion 65 then prepares eight tentative timetables, respectively expressing eight paths respectively passing through the effective processing units MPC1 to MPC8 in the first processing zone PZ1, for the first substrate W1. Similarly, the scheduling function portion 65 prepares eight tentative timetables, respectively expressing eight paths respectively passing through the effective processing units MPC1 to MPC8 in the first processing zone PZ1, for the second substrate W2. Further, the scheduling function portion 65 executes main scheduling for each of the tentative timetables prepared for the first substrate W1 to prepare a plan of processing the first substrate W1 at one processing unit MPC (for example, the processing unit MPC1). Similarly, the scheduling function portion 65 executes main scheduling for each of the tentative timetables prepared for the second substrate W2 to prepare a plan of processing the second substrate W2 at one processing unit MPC (for example, the processing unit MPC2). If the processing time required by each of the processing units MPC1 and MPC2 for the processing of the substrate W1 or W2 is 120 seconds, the zone usage rate of the first processing zone PZ1 will be 30 (=2×120/8). Also, the times at which the processings of the substrates W1 and W2 at the processing units MPC1 and MPC2 finish will be the unit final usage times t1 and t2, respectively, and the later of these becomes the zone final usage time T1 of the first processing zone PZ1. When the scheduling of the two substrates W1 and W2 is finished, transfer of the substrates W1 and W2 starts.

The scheduling function portion 65 further performs scheduling of the next two substrates W3 and W4. When this scheduling is started, the zone usage rates of the second and third processing zones PZ2 and PZ3 are both of the minimum value "0" and the zone final usage times of the second and third processing zones PZ2 and PZ3 are both of the initial value. The scheduling function portion 65 thus selects the second processing zone PZ2, which is of the lower number between the two. The scheduling function portion 65 then prepares eight tentative timetables, respectively expressing eight paths respectively passing through the effective processing units MPC9 to MPC16 in the second processing zone PZ2, for the third substrate W3. Similarly, the scheduling function portion 65 prepares eight tentative timetables, respectively expressing eight paths respectively passing through the effective processing units MPC9 to MPC16 in the second processing zone PZ2, for the fourth substrate W4. The scheduling function portion 65 then executes main scheduling for each of the eight tentative timetables prepared for the third substrate W3 to prepare a plan of processing the third substrate W3 at one processing unit MPC (for example, the processing unit MPC9). Similarly, the scheduling function portion 65 executes main scheduling for each of the eight tentative timetables prepared for the fourth substrate W4 to prepare a plan of processing the fourth substrate W4 at one processing unit MPC (for example, the processing unit MPC10). If the processing time required by each of the processing units MPC9 and MPC10 for the processing of the substrate W3 or W4 is 120 seconds, the zone usage rate of the second processing zone PZ2 will be 30 (=2×120/8). Also, the times at which the processings of the substrates W3 and W4 at the processing units MPC9 and MPC10 finish will be the unit final usage times t9 and t10, respectively, and the later of these becomes the zone final usage time T2 of the second processing zone PZ2. When the scheduling of the two substrates W3 and W4 is finished, transfer of the substrates W3 and W4 starts.

The scheduling function portion 65 further performs scheduling of the next two substrates W5 and W6. When this scheduling is started, the zone usage rate of the third processing zones PZ3 is of the minimum value "0." The scheduling function portion 65 thus selects the third processing zone PZ3. The scheduling function portion 65 then prepares eight tentative timetables, respectively expressing eight paths respectively passing through the effective processing units MPC17 to MPC24 in the third processing zone PZ3, for the fifth substrate W5. Similarly, the scheduling function portion 65 prepares eight tentative timetables, respectively expressing eight paths respectively passing through the effective processing units MPC17 to MPC24 in the third processing zone PZ3, for the sixth substrate W6. The scheduling function portion 65 then executes main scheduling for each of the eight tentative timetables prepared for the fifth substrate W5 to prepare a plan of processing the fifth substrate W5 at one processing unit MPC (for example, the processing unit MPC17). Similarly, the scheduling function portion 65 executes main scheduling for each of the eight tentative timetables prepared for the sixth substrate W6 to prepare a plan of processing the sixth substrate W6 at one processing unit MPC (for example, the processing unit MPC18). If the processing time required by each of the processing units MPC17 and MPC18 for the processing of the substrate W5 or W6 is 120 seconds, the zone usage rate of the third processing zone PZ3 will be 30 (=2×120/8). Also, the times at which the processings of the substrates W5 and W6 at the processing units MPC17 and MPC18 finish will be the unit final usage times t17 and t18, respectively, and the later of these becomes the zone final usage time T3 of the third processing zone PZ3. When the scheduling of the two substrates W5 and W6 is finished, transfer of the substrates W5 and W6 starts.

FIG. 15B is referenced. If when processings of the two substrates W7 and W8 of the process job PJ2 are planned, all of the processings of the process job PJ1 are finished, the zone usage rates of the first to third processing zones PZ1, PZ2, and PZ3 will all be 0. The scheduling function portion 65 thus compares the zone final usage times T1, T2, and T3 of the first to third processing zones PZ1, PZ2, and PZ3, and selects the first processing zone PZ1 corresponding to the oldest zone final usage time T1 (see FIG. 15A). Further, the scheduling function portion 65 prepares eight tentative timetables, respectively expressing eight paths respectively passing through the effective processing units MPC1 to MPC8 in the first processing zone PZ1, for the seventh substrate W7. Similarly, the scheduling function portion 65 prepares eight tentative timetables, respectively expressing eight paths respectively passing through the effective processing units MPC1 to MPC8 in the first processing zone PZ1, for the eighth substrate W8. The scheduling function portion 65 then executes main scheduling for each of the eight tentative timetables prepared for the seventh substrate W7 and selects one processing unit MPC.

In the example of FIG. 15B, at a time a21 at which the first main transfer robot CR1 can carry in the substrate W7, none of the processing units MPC1 to MPC8 of the first processing zone PZ1 is processing a substrate W and therefore processing of the substrate W7 may be planned at any of the processing units MPC1 to MPC8 and these are also practically the same in estimated substrate processing finishing time. On the other hand, whereas the unit final usage times t1 and t2 of the processing units MPC1 and MPC2 are of significant values other than the initial value, the unit final usage times t3 to t8 of the other processing units MPC3 to MPC8 are all of the initial value. The scheduling function portion 65 thus selects the main scheduling using the tentative timetable passing through the processing unit MPC3, which, among the processing units MPC3 to MPC8, is of the lowest number, and prepares a plan of processing the seventh substrate W7 at the processing unit MPC3. The scheduling function portion 65 likewise prepares a plan of processing the eighth substrate W8 at the processing unit MPC4. If the processing time required by each of the processing units MPC3 and MPC4 for the processing of the substrate W7 or W8 is 120 seconds, the zone usage rate of the first processing zone PZ1 will be 30 (=2×120/8). Also, the times at which the processings of the substrates W7 and W8 at the processing units MPC3 and MPC4 finish will be the unit final usage times t3 and t4, respectively, and the later of these becomes the zone final usage time T1 of the first processing zone PZ1.

As described above, with the present preferred embodiment, the substrates W are transferred in units of two each, and accordingly, the planning of substrate processing is executed in units of two substrates each.

Although specific preferred embodiments of the present invention have been described above, the present invention may be implemented in yet other modes as listed for example below.

1. With each of the preferred embodiments described above, the first processing zone PZ1, the second processing zone PZ2, and the third processing zone PZ3 are respectively constituted of an equal number of processing units MPC. However, there is no need for the plurality of processing zones PZ to be constituted respectively of the same number of processing units MPC. For example, the second processing zone PZ2 and the third processing zone PZ3 may be united to arrange a single second processing zone PZ2 with 16 processing units MPC that are directly accessed by the second main transfer robot CR2.

2. With each of the preferred embodiments described above, the processing zones PZ are set up by grouping together processing units MPC in accordance with the substrate transfer path length or the substrate transfer time. However, the plurality of processing units MPC may be classified into a plurality of groups based on a standard other than the above. For example, the processing units MPC may be classified into those with odd numbers assigned thereto and processing units MPC with even numbers assigned thereto or classified into a plurality of groups according to a remainder resulting from dividing the number of each processing unit MPC by a divisor constituted of a natural number not less than 3. Also, the processing units MPC may be grouped into those at one side of the transfer passage 5 and processing units MPC at the other side of the transfer passage 5. Further, the processing units MPC may be grouped according to the layer at which each processing unit MPC is disposed to forma first group with the processing units MPC disposed at a first layer portion, form a second group with the processing units MPC disposed at a second layer portion, form a third group with the processing units MPC disposed at a third layer portion, and form a fourth group with the processing units MPC disposed at a fourth layer portion. That is, whereas with each of the preferred embodiments described above, grouping is performed based on a layout of the processing units MPC in the horizontal direction, grouping may instead be performed based on a layout of the processing units MPC in the vertical direction.

3. Although with the preferred embodiments described above, the front surface cleaning unit (FIG. 3) and the end surface cleaning unit (FIG. 4) were indicated as examples of the processing unit MPC, the type of processing unit is obviously not restricted to these. Other types of processing unit, for example, a front surface scrub cleaning unit, which cleans the front surface of a substrate W by a scrubbing member, a rear surface cleaning unit, which cleans a rear surface of a substrate W, etc., may be included in the substrate processing apparatus 1. Also, the type of processing unit included in the substrate processing apparatus 1 is not required to be singular and a plurality of types of processing units may be included in a single substrate processing apparatus 1.

4. With each of the preferred embodiments described above, the first, second, and third chemical liquid cabinets CC1, CC2, and CC3 are provided in correspondence to the first to the third processing zones PZ1, PZ2, and PZ3. However, a plurality of processing zones PZ may share a single chemical liquid cabinet and the single chemical liquid cabinet may be provided with a plurality of pressure-feeding devices, such as pumps, etc., respectively corresponding to the plurality of processing zones PZ. In this case, the pressure-feeding devices can be made uniform in degree of wear by uniform selection of the plurality of processing zones PZ.

5. With each of the preferred embodiments described above, a processing zone PZ is selected based on a relationship of magnitudes of the zone usage rates and if the zone usage rates are equal, a processing zone PZ is selected based on the zone final usage times, and if the zone final usage times are equal, a processing zone PZ is selected based on the zone number. The selection of a processing zone PZ by zone number is, in the case of each of the preferred embodiments described above, a selection based on transfer distance or transfer time from the carrier holding portion 2. That is, in the selection of a processing zone PZ in the preferred embodiments described above, first priority is given to the zone usage rate, second priority is given to the zone final usage time, and third priority is given to the zone number (transfer distance or transfer time). However the order of priority of the zone final usage time and the zone usage rate may be inverted. Also, the zone number (transfer distance or transfer time) may be given a higher priority. For example, a state where first priority is given to the zone number (transfer distance or transfer time) may be set as a default state and on the other hand, when a difference of zone usage rates among the processing zones PZ exceeds a certain threshold, transition to a state where first priority is given to the zone usage rate may be performed to perform processing zone selection with priority given to the zone usage rate over the zone number. Similarly, a state where first priority is given to the zone number (transfer distance or transfer time) may be set as a default state and on the other hand, when a difference of zone final usage times among the processing zones PZ exceeds a certain threshold, transition to a state where first priority is given to the zone final usage time may be performed to perform processing zone selection with priority given to the zone final usage time over the zone number.

6. Unit cumulative usage times of use of processing units MPC for processing of substrates may be computed and recorded, the unit cumulative usage times of the processing units MPC belonging to each processing zone PZ (group) may be added together to determine zone cumulative usage times (group cumulative usage times), and a processing zone PZ may be selected based on the zone cumulative usage times (with preferably the processing zone PZ of the shortest zone cumulative usage time being selected).

7. The selection of a processing zone PZ (group) may be performed randomly, for example, based on random numbers to perform uniform selection among the plurality of processing zones PZ.

While preferred embodiments of the present invention have been described in detail above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2016-069183 filed on Mar. 30, 2016 in the Japan Patent Office, and the entire disclosure of this application is incorporated herein by reference.

What is claimed is:

1. A substrate processing apparatus comprising:
a carrier holding unit which holds a carrier that contains substrates;
a plurality of processing units, each of which processes a substrate;
a substrate transfer unit which transfers substrates between the carrier held by the carrier holding unit and the plurality of processing units; and
a controller which controls the plurality of processing units and the substrate transfer unit, the controller including a processor and a storage device, the storage device storing a classification data indicative of a classification of the plurality of processing units into a plurality of groups and a group usage history data indicative of a usage history of each of the groups;
wherein the controller is programmed such that the processor executes, when determining a processing unit that is to process a substrate, a group selection step of selecting one of the plurality of groups, a unit selection step of, after the group selection step, selecting one processing unit which belongs to the one group selected in the group selection step, a step of controlling the substrate transfer unit to carry a substrate to be processed into the processing unit selected in the unit selection step, a step of generating the group usage history data including a group usage rate data and a group final usage time data, and a step of registering the group usage history data thus generated into the storage device, and that the processor selects, in the group selection step, one of the groups based on the classification data and the group usage history data stored in the storage device, the group usage rate data being indicative of a group usage rate which is a rate of use for substrate processing of processing units which belong to each group, the group final usage time data being indicative of a group final usage time which is the time at which each group was used last for substrate processing,
wherein the group selection step includes a step of selecting at least one group of which group usage rate is the lowest based on the group usage rate data stored in the storage device, and a step of selecting, when more than one group of which group usage rates are the lowest exist, a group of which group final usage time is the oldest based on the group final usage time data stored in the storage device.

2. The substrate processing apparatus according to claim 1, wherein the classification data includes a data indicative of the classification of the plurality of processing units such that the plurality of processing units are classified into the plurality of groups based on transfer path lengths or transfer times between the carrier holding unit and the respective processing units.

3. The substrate processing apparatus according to claim 1, wherein the substrate transfer unit includes a first transfer robot and a second transfer robot that receives and passes a substrate from and to the first transfer robot, the classification data includes a data indicative of the classification of the plurality of processing units such that the plurality of groups include a first group, constituted of processing units accessed directly by the first transfer robot, and a second group, constituted of processing units accessed directly by the second transfer robot, and substrate transfer between the carrier held by the carrier holding unit and a processing unit of the second group is performed by both the first transfer robot and the second transfer robot.

4. The substrate processing apparatus according to claim 1, wherein the plurality of processing units are arranged to process substrates by a processing fluid, and the classification data includes a data indicative of the classification of the plurality of processing units such that the plurality of processing units are classified into the plurality of groups according to each plurality of processing units which share a processing fluid supply source that supplies the processing fluid.

5. The substrate processing apparatus according to claim 1, wherein the processor performs uniform selection among the plurality of groups in the group selection step.

6. The substrate processing apparatus according to claim 1, wherein the processor performs uniform selection among the processing units in each group in the unit selection step.

7. The substrate processing apparatus according to claim 1, wherein the processor performs, in the unit selection step, a step of recording, into the storage device, a unit final usage time, which is the time at which each processing unit was used last for substrate processing, and a step of selecting the processing unit of the oldest unit final usage time stored in the storage device.

8. A substrate processing method comprising:

a step of classifying a plurality of processing units, each of which processes a substrate, into a plurality of groups, and storing, in a storage device, a classification data indicative of the classification of the plurality of processing units into the plurality of groups;

a group selection step of selecting one of the plurality of groups by a processor based on the classification data stored in the storage device;

a unit selection step of, after the group selection step, selecting one processing unit which belongs to the one group selected in the group selection step by the processor;

a step of controlling a substrate transfer unit by the processor, to carry a substrate to be processed into the processing unit selected in the unit selection step;

a step of generating a group usage history data including a group usage rate data and a group final usage time data by the processor, the group usage rate data being indicative of a group usage rate which is a rate of use for substrate processing of processing units which belong to each group, the group final usage time data being indicative of a group final usage time which is the time at which each group was used last for substrate processing; and a step of registering the group usage history data thus generated into the storage device by the processor, wherein the group selection step includes a step of selecting at least one group of which group usage rate is the lowest based on the group usage rate data stored in the storage device, and a step of selecting, when more than one group of which group usage rates are the lowest exist, a group of which group final usage time is the oldest based on the group final usage time data stored in the storage device.

9. The substrate processing method according to claim 8, wherein the classification data includes a data indicative of the classification of the plurality of processing units such that the plurality of processing units are classified into the plurality of groups based on transfer path lengths or transfer times between a carrier holding unit, which holds a carrier that contains substrates, and the respective processing units, and the substrate transfer unit transfers a substrate from the carrier to the processing unit selected in the unit selection step.

10. The substrate processing method according to claim 8, wherein the substrate transfer unit includes a first transfer robot and a second transfer robot that receives and passes a substrate from and to the first transfer robot, the classification data includes a data indicative of the classification of the plurality of processing units such that the plurality of groups include a first group, constituted of processing units accessed directly by the first transfer robot, and a second group, constituted of processing units accessed directly by the second transfer robot, and substrate transfer between the carrier held by the carrier holding unit and a processing unit of the second group is performed by both the first transfer robot and the second transfer robot.

11. The substrate processing method according to claim 8, wherein the plurality of processing units are arranged to process substrates by a processing fluid, and the classification data includes a data indicative of the classification of the plurality of processing units such that the plurality of processing units are classified into the plurality of groups according to each plurality of processing units which share a processing fluid supply source that supplies the processing fluid.

12. The substrate processing method according to claim 8, wherein uniform selection among the plurality of groups is performed by the processor in the group selection step.

13. The substrate processing method according to claim 8, wherein the processor performs uniform selection among the processing units in each group in the unit selection step.

14. The substrate processing method according to claim 8, wherein the processor performs, in the unit selection step, a step of recording, into the storage device, a unit final usage time, which is the time at which each processing unit was used last for substrate processing, and a step of selecting the processing unit of the oldest unit final usage time stored in the storage device.

* * * * *